US008786055B2

United States Patent
Kawashima

(10) Patent No.: US 8,786,055 B2
(45) Date of Patent: Jul. 22, 2014

(54) SOLID-STATE IMAGING DEVICE, METHOD FOR MANUFACTURING SOLID-STATE IMAGING DEVICE, METHOD FOR MANUFACTURING SOLID-STATE IMAGING ELEMENT, AND SEMICONDUCTOR DEVICE

(75) Inventor: Hiroyuki Kawashima, Kumamoto (JP)

(73) Assignee: Sony Corporation (JP)

( * ) Notice: Subject to any disclaimer, the term of this patent is extended or adjusted under 35 U.S.C. 154(b) by 280 days.

(21) Appl. No.: 12/948,029

(22) Filed: Nov. 17, 2010

(65) Prior Publication Data

US 2011/0127631 A1 Jun. 2, 2011

(30) Foreign Application Priority Data

Nov. 30, 2009 (JP) ................................. 2009-271280

(51) Int. Cl.
*H01L 23/544* (2006.01)
(52) U.S. Cl.
USPC .......................................... 257/620; 438/462
(58) Field of Classification Search
CPC .................................................... H01L 41/0838
USPC .......................................... 438/462; 257/777
See application file for complete search history.

(56) References Cited

U.S. PATENT DOCUMENTS

| 5,994,762 | A * | 11/1999 | Suwanai et al. | 257/620 |
| 2003/0104679 | A1 * | 6/2003 | Dias et al. | 438/462 |
| 2003/0199149 | A1 * | 10/2003 | Lee et al. | 438/424 |
| 2010/0078774 | A1 * | 4/2010 | Hirler | 257/652 |

FOREIGN PATENT DOCUMENTS

| JP | H08-037289 | 2/1996 |
| JP | 2005-150463 | 6/2005 |
| JP | 2006-140404 | 6/2006 |
| JP | 2006-173476 | 6/2006 |
| JP | 2008-182142 | 8/2008 |
| JP | 2009-141074 | 6/2009 |

OTHER PUBLICATIONS

Official Action (no English translation available) for Japanese Patent Application No. 2009-271280 mailed Dec. 3, 2013, 5 pages.

\* cited by examiner

*Primary Examiner* — Yu-Hsi D Sun
(74) *Attorney, Agent, or Firm* — Sheridan Ross P.C.

(57) ABSTRACT

A solid-state imaging device includes a semiconductor substrate configured to include a solid-state imaging element that is provided with a photoelectric conversion region, and a scribe line region that is provided along a periphery of the solid-state imaging element, a wiring layer that is formed to be layered on the semiconductor substrate, a support substrate that is formed to be layered on the wiring layer, and a groove that is provided between a blade region in the scribe line region and the solid-state imaging element, in the semiconductor substrate and penetrates through the semiconductor substrate.

15 Claims, 19 Drawing Sheets

PRIOR ART

SOLID-STATE IMAGING DEVICE, METHOD FOR MANUFACTURING SOLID-STATE IMAGING DEVICE, METHOD FOR MANUFACTURING SOLID-STATE IMAGING ELEMENT, AND SEMICONDUCTOR DEVICE

BACKGROUND OF THE INVENTION

1. Field of the Invention

The present invention relates to a solid-state imaging device, a method for manufacturing a solid-state imaging device, a method for manufacturing a solid-state imaging element, and a semiconductor device. In particular, the present invention relates to a solid-state imaging device in which a plurality of semiconductor substrates are layered, a method for manufacturing the solid-state imaging device, a method for manufacturing a solid-state imaging element in which a plurality of semiconductor substrates are layered, and a semiconductor device.

2. Description of the Related Art

Commonly, in manufacturing of a semiconductor chip, after a plurality of semiconductor chips are formed on a wafer, the wafer is diced with a blade along a scribe line provided around the semiconductor chips so as to divide the wafer into individual semiconductor chips.

For suppressing chipping occurring in the dicing with a blade, such a structure is proposed that a chipping prevention wall (guard ring) for suppressing progression of film peeling in dicing is formed inside a wiring layer which is positioned in the scribe line.

In recent years, a three-dimensional mounting technique by which a plurality of semiconductor substrates are bonded to each other has been generally employed. Japanese Unexamined Patent Application Publication No. 2008-182142 proposes a back-illuminated type solid-state imaging device in which a semiconductor substrate is bonded to a support substrate. Further, a semiconductor device in which semiconductor wafers are bonded to each other and are connected to each other by a through electrode is also proposed.

SUMMARY OF THE INVENTION

However, in the semiconductor device which is mounted by the three-dimensional mounting technique, a thick semiconductor substrate (for example, 2 µm to 10 µm) is interposed between a surface to which a blade strikes in dicing and the support substrate which is a base. Thus, the dicing is different from common dicing.

Therefore, as shown in FIG. 20, chipping C propagates at an interface between a semiconductor substrate 101 and an insulation film (an insulation film constituting a wiring layer) 102 which is an upper layer of the semiconductor substrate 101. Further, the chipping C propagates also inside the insulation film (the wiring layer) 102 which is the upper layer of the semiconductor substrate 101. Thus, in the semiconductor device mounted by the three-dimensional mounting technique, specific chipping which does not occur in a semiconductor device which is not three-dimensionally mounted occurs.

When the chipping reaches a semiconductor chip region, a product defect occurs and a yield may be disadvantageously degraded. Here, in FIG. 20, a reference numeral 103 denotes a guard ring and a reference numeral 104 denotes a support substrate.

It is desirable to provide a solid-state imaging device, a method for manufacturing a solid-state imaging device, a method for manufacturing a solid-state imaging element, and a semiconductor device that can suppress chipping even in a case where the three-dimensional technique is employed.

A solid-state imaging device according to an embodiment of the present invention includes a semiconductor substrate configured to include a solid-state imaging element that is provided with a photoelectric conversion region and a scribe line region that is provided along a periphery of the solid-state imaging element, a wiring layer that is formed to be layered on the semiconductor substrate, a support substrate that is formed to be layered on the wiring layer, and a groove that is provided between a blade region in the scribe line region and the solid-state imaging element, in the semiconductor substrate and penetrates through the semiconductor substrate.

The groove which is provided between the blade region in the scribe line region and the solid-state imaging element, in the semiconductor substrate and penetrates through the semiconductor substrate can suppress chipping propagating at an interface between the semiconductor substrate and the wiring layer.

Further, provision of a guard ring layer in a region of the wiring layer can suppress chipping propagating inside the wiring layer. The region of the wiring layer corresponds to a region, which is between the blade region in the scribe line region and the solid-state imaging element, of the semiconductor substrate.

It is considered that when the chipping propagating inside the wiring layer reaches the guard ring layer, the chipping changes its propagating direction to a semiconductor substrate side and propagates at the interface between the semiconductor substrate and the wiring layer. Therefore, it is preferable that the guard ring layer be formed in the region, which corresponds to a region between the blade region and the groove in the semiconductor substrate, of the wiring layer.

A method for manufacturing a solid-state imaging device according to an embodiment of the present invention includes the steps of forming a solid-state imaging element that includes a photoelectric conversion region in a semiconductor substrate, forming a groove having a bottom between a blade region in a scribe line region and a forming region of the solid-state imaging element, in the semiconductor substrate, filling a predetermined material in the groove, forming and layering a wiring layer on a surface, which is at a side at which the groove filled with the predetermined material is formed, of the semiconductor substrate, and thinning the semiconductor substrate from a surface, which is opposite to the surface facing the wiring layer, of the semiconductor substrate so as to remove the bottom of the groove.

A method for manufacturing a solid-state imaging element according to an embodiment of the present invention includes the steps of forming a solid-state imaging element that includes a photoelectric conversion region in a semiconductor substrate, forming a groove having a bottom between a blade region in a scribe line region and a forming region of the solid-state imaging element, in the semiconductor substrate, filling a predetermined material in the groove, forming and layering a wiring layer on a surface, which is at a side at which the groove filled with the predetermined material is formed, of the semiconductor substrate, thinning the semiconductor substrate from a surface, which is opposite to the surface facing the wiring layer, of the semiconductor substrate so as to remove the bottom of the groove, and dicing the semiconductor substrate that is thinned at the blade region.

The groove having a bottom is formed between the blade region in the scribe line region and the forming region of a solid-state imaging element, in the semiconductor substrate and then the semiconductor substrate is thinned from the surface, which is opposite to the surface facing the wiring layer, of the semiconductor substrate so as to remove the bottom of the groove. Thus, the groove penetrating through the semiconductor substrate can be formed between the blade region in the scribe line region and the solid-state imaging element, in the semiconductor substrate. The groove can suppress chipping propagating at the interface between the semiconductor substrate and the wiring layer.

Here, the groove having a bottom may be formed between the blade region in the scribe line region and the forming region of the solid-state imaging element, in the semiconductor substrate after the solid-state imaging element including the photoelectric conversion region is formed in the semiconductor substrate, or the solid-state imaging element including the photoelectric conversion region may be formed in the semiconductor substrate after the groove having a bottom is formed between the blade region in the scribe line region and the forming region of the solid-state imaging element, in the semiconductor substrate.

A semiconductor device according to an embodiment of the present invention includes a first semiconductor substrate configured to include a semiconductor chip and a scribe line region that is provided along a periphery of the semiconductor chip, a wiring layer that is formed to be layered on the first semiconductor substrate, a second semiconductor substrate that is formed to be layered on the wiring layer, and a groove that is provided between a blade region in the scribe line region and the semiconductor chip, in the first semiconductor substrate and penetrates through the first semiconductor substrate.

The groove which is provided between the blade region in the scribe line region and the semiconductor chip, in the first semiconductor substrate and penetrates through the first semiconductor substrate can suppress chipping propagating at an interface between the first semiconductor substrate and the wiring layer.

In the solid-state imaging device, the method for manufacturing a solid-state imaging device, the method for manufacturing a solid-state imaging element, and the semiconductor device according to the embodiments of the present invention, chipping can be suppressed and therefore improvement of a manufacturing yield can be realized.

DESCRIPTION OF THE PREFERRED EMBODIMENTS

Figure 1:
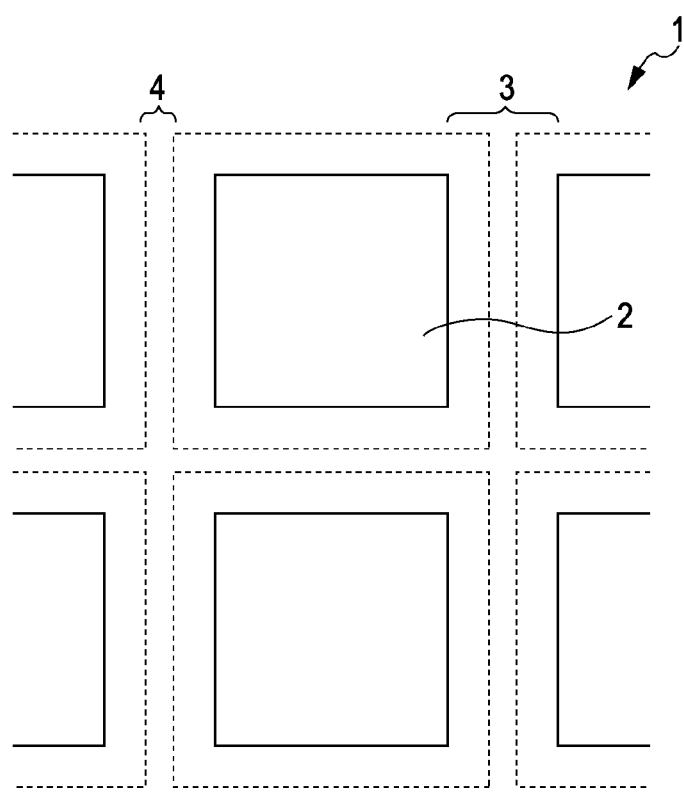
FIG. 1 schematically illustrates an example of a solid-state imaging device to which an embodiment of the present invention is applied.

Embodiments of the present invention will be described below in the following order.
1. Embodiment
2. Another Embodiment
3. Modification 1. Embodiment Configuration of Solid-State Imaging Device FIG. 1 schematically illustrates an example of a solid-state imaging device to which an embodiment of the present invention is applied. In a solid-state imaging device 1 shown in FIG. 1, a plurality of back-illuminated type solid-state imaging elements (semiconductor chips) 2 are formed and a scribe line 3 is provided in a gap between the solid-state imaging elements 2. Further, a blade region 4 is provided in the scribe line 3.

Figure 2:
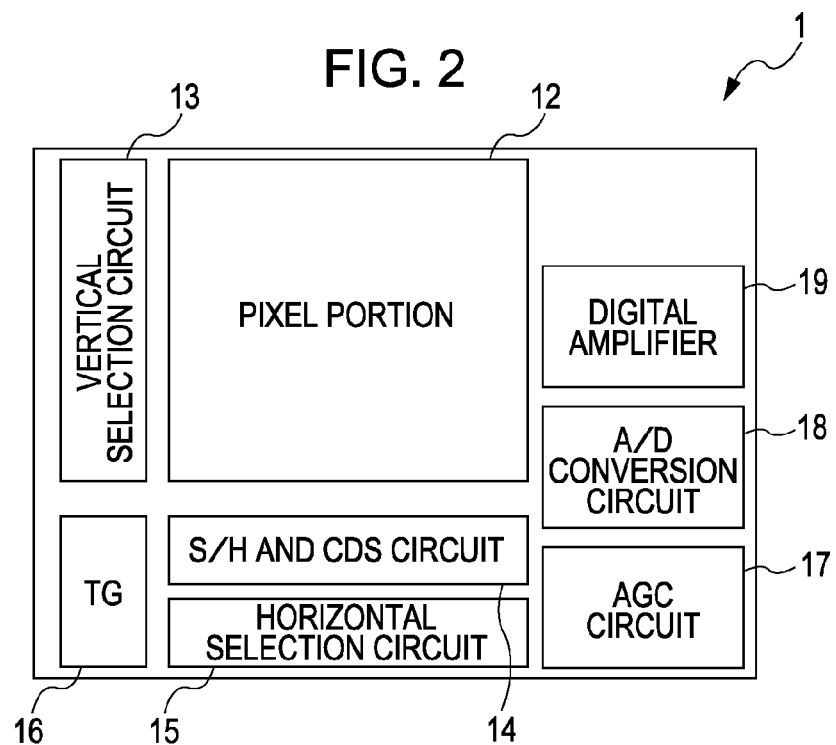
FIG. 2 schematically illustrates the solid-state imaging device.

The solid-state imaging device 1 includes a pixel portion 12 and a peripheral circuit portion that are mounted on a single semiconductor substrate, as shown in FIG. 2. The peripheral circuit portion includes a vertical selection circuit 13, a sample-hold and correlated double sampling (S/H and CDS) circuit 14, a horizontal selection circuit 15, a timing generator (TG) 16, an automatic gain control (AGC) circuit 17, an A/D conversion circuit 18, and a digital amplifier 19.

In the pixel portion 12, multiple number of unit pixels, which will be described later, are arranged in matrix, an address line and the like are provided row by row, and a signal line and the like are provided column by column.

The vertical selection circuit 13 sequentially selects pixels row by row and reads out a signal of each of the pixels in every pixel column through a vertical signal line to the S/H and CDS circuit 14. The S/H and CDS circuit 14 performs signal processing such as correlated double sampling (CDS) on the pixel signal read out from each pixel column.

The horizontal selection circuit 15 sequentially takes out the pixel signal held in the S/H and CDS circuit 14 and outputs the pixel signal to the AGC circuit 17. The AGC circuit 17 amplifies the signal received from the horizontal selection circuit 15 by an appropriate gain and outputs the signal to the A/D conversion circuit 18.

The A/D conversion circuit 18 converts an analog signal received from the AGC circuit 17 to a digital signal and outputs the digital signal to the digital amplifier 19. The digital amplifier 19 appropriately amplifies the digital signal received from the A/D conversion circuit 18 and outputs the amplified signal from a pad (terminal).

The vertical selection circuit 13, the S/H and CDS circuit 14, the horizontal selection circuit 15, the AGC circuit 17, the A/D conversion circuit 18, and the digital amplifier 19 are respectively operated based on various types of timing signals outputted from the timing generator 16.

Figure 3:
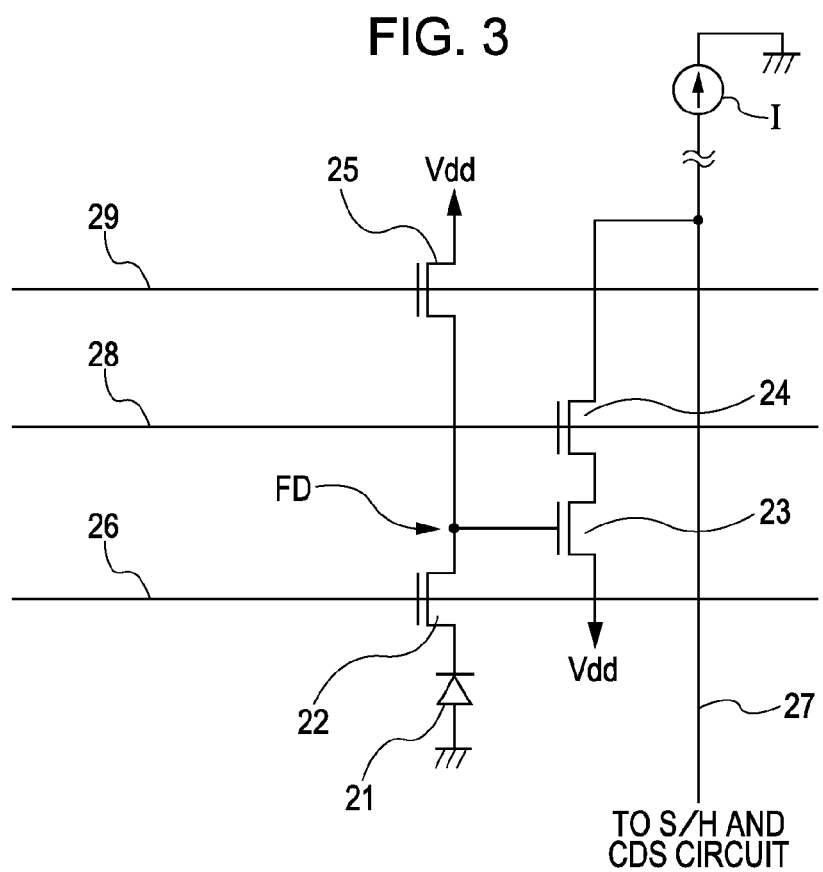
FIG. 3 schematically illustrates an example of the circuit configuration of a unit pixel of a pixel portion.

FIG. 3 schematically illustrates an example of the circuit configuration of a unit pixel of the pixel portion 12. A unit pixel includes a photodiode 21, for example, as a photoelectric conversion element, and includes four transistors of a transfer transistor 22, an amplification transistor 23, an address transistor 24, and a reset transistor 25 as active elements with respect to one photodiode 21.

The photodiode 21 photoelectrically converts incident light to electric charge (an electron in this case) of an amount which corresponds to an amount of the incident light. The transfer transistor 22 is connected between the photodiode 21 and a floating diffusion FD. When a drive signal is applied to a gate (transfer gate) of the transfer transistor 22 through a drive wiring 26, the transfer transistor 22 transfers the electron which is obtained by photoelectric conversion by the photodiode 21 to the floating diffusion FD.

To the floating diffusion FD, a gate of the amplification transistor 23 is connected. The amplification transistor 23 is coupled to a vertical signal line 27 through the address transistor 24 and constitutes a source follower together with a constant current source I which is outside the pixel portion. When an address signal is applied to a gate of the address transistor 24 through a drive wiring 28 and the address transistor 24 is turned on, the amplification transistor 23 amplifies a potential of the floating diffusion FD to output a voltage corresponding to the potential to the vertical signal line 27. The voltage outputted from each of the pixels is outputted to the S/H and CDS circuit 14 through the vertical signal line 27.

The reset transistor 25 is connected between a power source Vdd and the floating diffusion FD. When a reset signal is applied to a gate of the reset transistor 25 through a drive wiring 29, the reset transistor 25 resets a potential of the floating diffusion FD to a power source potential Vdd. Since respective gates of the transfer transistor 22, the address transistor 24, and the reset transistor 25 are coupled row by row, these operations are simultaneously performed for respective pixels in one row.

Figure 4:
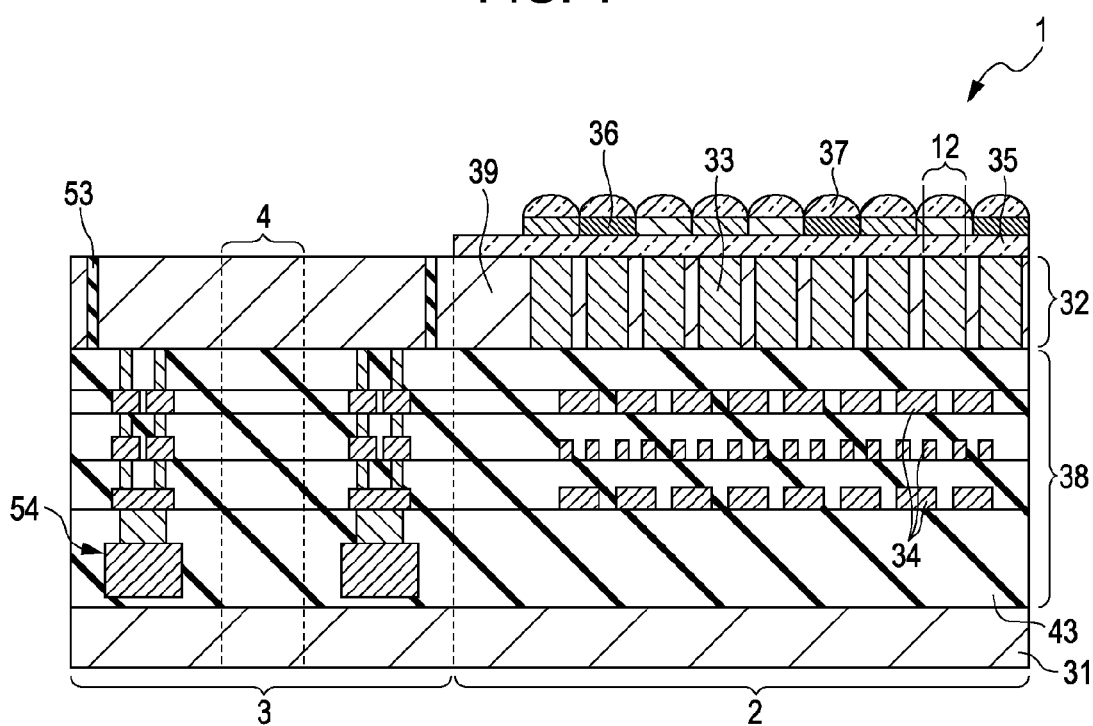
FIG. 4 is a sectional view schematically illustrating an example of the solid-state imaging device to which the embodiment of the present invention is applied.

FIG. 4 is a sectional view schematically illustrating an example of a solid-state imaging device to which the embodiment of the present invention is applied. Here, a back-illuminated type solid-state imaging element receives light from an opposite surface (referred to below as a "backside" of a semiconductor substrate) to a surface on which a wiring layer 38 is formed (referred to below as a "surface" of the semiconductor substrate).

The solid-state imaging element 2 shown in FIG. 4 is chiefly composed of a semiconductor support substrate 31, a semiconductor substrate 32, a passivation film 35, a color filter 36, and a micro-lens 37.

The semiconductor substrate 32 is made of n-type silicon. Further, the semiconductor substrate 32 includes a plurality of light receiving portions 33 constituting a unit pixel and an element forming layer 39 in which active elements (not shown) such as a MOS transistor which converts a signal charge obtained by photoelectric conversion by the light receiving portions 33 to an electric signal and outputs the electric signal are formed.

The light receiving portion 33 corresponds to the photodiode 21 shown in FIG. 3 and is configured by a pn junction in the semiconductor substrate 32.

Here, the semiconductor substrate 32 is formed by thinning a silicon wafer so as to be able to receive light from a backside thereof.

Though it depends on a kind of the solid-state imaging element, the thickness of the semiconductor substrate 32 is about 2 μm to 6 μm in a case for visible light and is about 6 μm to 10 μm in a case for near infrared.

On the surface of the semiconductor substrate 32, the wiring layer 38 which performs electrical-wiring with respect to the active elements such as the MOS transistor in a multiple layered fashion is formed. To the wiring layer 38, the semiconductor support substrate 31 is bonded with a silicon dioxide layer (not shown) interposed. The wiring layer 38 is composed of wiring 34 and an insulation film 43 which covers the wiring 34.

Further, the semiconductor support substrate 31 is provided so as to secure strength of the semiconductor substrate 32. The semiconductor support substrate 31 is a silicon substrate, for example, and the thickness thereof is about 725 μm, for example.

The color filter 36 performs spatial color separation with color filters of three colors of red (R), green (G), and blue (B), for example (arranged in an RGB Bayer arrangement).

Here, favorable color reproduction is enabled by arbitrarily adjusting a spectral characteristic of the color filter 36.

Figure 5:
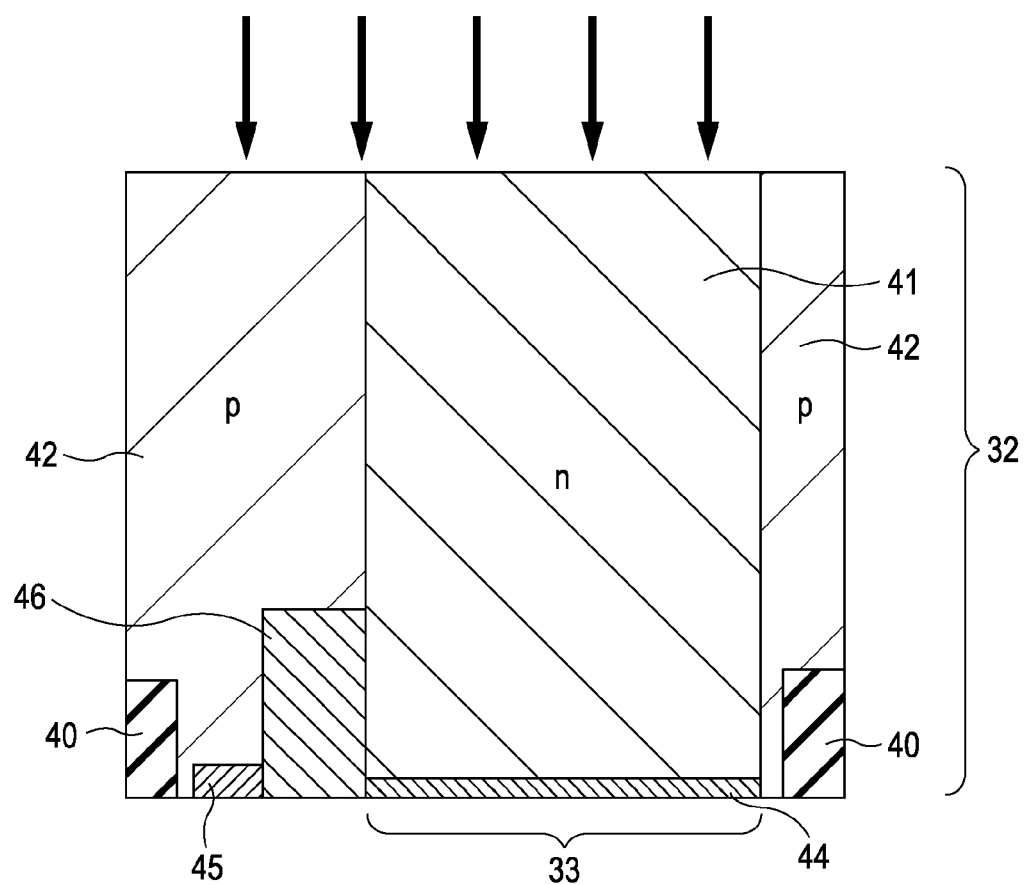
FIG. 5 is a chief part enlarged view of the pixel portion of a semiconductor substrate.

FIG. 5 is a chief part enlarged view of the pixel portion of the semiconductor substrate 32.

In a region of the light receiving portion 33 in the semiconductor substrate 32, an n-type charge accumulation region 41 is formed. In order to make a region, in which signal charges are accumulated, close to a surface side of the semiconductor substrate 32, the charge accumulation region 41 is preferably formed such that an impurity concentration becomes higher toward the surface side of the semiconductor substrate 32. Alternatively, in order to efficiently take in incident light, the charge accumulation region 41 may be formed such that an area becomes larger toward a backside of the semiconductor substrate 32.

Further, a p-type well 42 is formed at a periphery of the charge accumulation region 41, in the semiconductor substrate 32. A shallow p-type hole accumulation region 44 is formed in the region of the light receiving portion 33 to be positioned at the surface side of the semiconductor substrate 32.

At the surface side of the semiconductor substrate 32, an element isolation insulation film 40 made of silicon oxide is formed. Further, at the surface side of the semiconductor substrate 32, an n-type floating diffusion (FD) 45 is formed.

Between the floating diffusion 45 and the charge accumulation region 41, a p-type region 46 is formed so as to electrically isolate the floating diffusion 45 and the charge accumulation region 41.

Here, the scribe line 3 to be a region at which each of the solid-state imaging elements 2 is cut out is formed in a gap between adjacent solid-state imaging elements 2. In the scribe line 3, a chipping prevention wall 53 and a guard ring 54 are formed (refer to FIG. 4).

Specifically, in the semiconductor substrate 32, the chipping prevention walls 53 are formed at both sides of the blade region 4 in the scribe line 3. In the wiring layer 38, the guard rings 54 are formed at both sides of the blade region 4 in the scribe line 3.

The width of the scribe line 3 is determined depending on the width of the blade region 4, the width of the guard ring 54, and the width of the chipping prevention wall 53, and is about 50 μm to 200 μm. Here, the width of the blade region 4 is determined in consideration of the blade width and variation of a blade so as to be set to be about 30 μm to 80 μm.

The guard ring 54 is simultaneously formed in a forming process of the wiring layer 38 of the solid-state imaging element 2 and is principally made of the same material (aluminum, copper, tungsten, or the like, for example) as that of the wiring 34. The guard ring 54 functions to suppress chipping propagating inside the wiring layer 38 and to suppress moisture absorption from a wall at a semiconductor chip side, and the width thereof is set to be about 3 μm to 20 μm.

The chipping prevention wall 53 is formed such that a groove 55 is formed in a manner to penetrate through the element forming layer 39 and the groove 55 is filled with a predetermined material (for example, an insulation film, a conductive film, or a layered film composed of an insulation film and a conductive film) 56, for example. Alternatively, the whole inside of the groove 55 may be a hollow (that is, the groove 55 is filled with nothing) or a part of the groove 55 may be filled with a predetermined material.

When the chipping prevention wall 53 is formed to have the width in a range from about 0.1 μm to 20 μm, the chipping prevention wall 53 can suppress chipping propagating at an interface between the semiconductor substrate 32 and the wiring layer 38.

Figure 6:
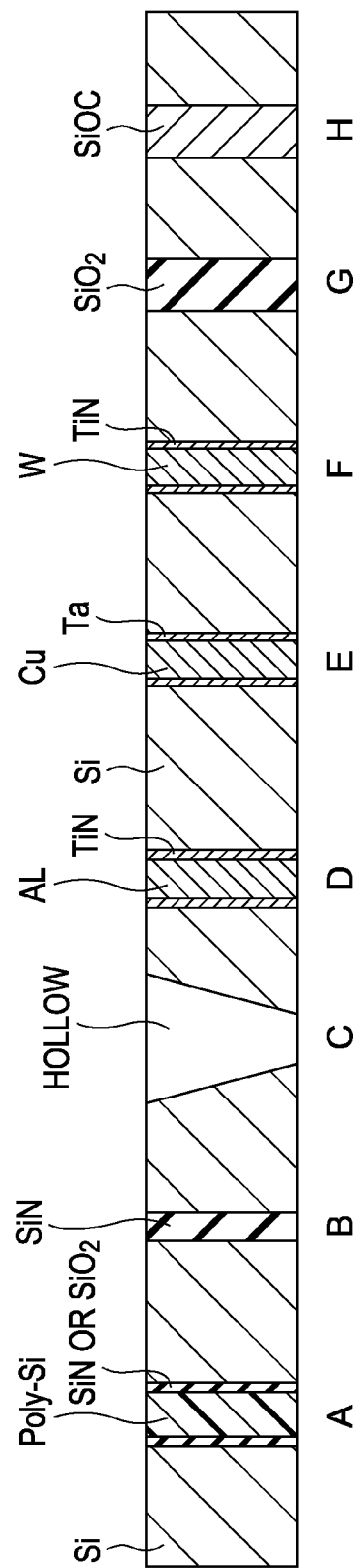
FIG. 6 schematically illustrates the configuration of a chipping prevention wall.

Examples of the specific configuration of the chipping prevention wall 53 include the following configurations: as shown in FIG. 6, (1) the configuration in which a SiN layer or a $SiO_2$ layer is formed on a wall surface of the groove 55 and the inside of the groove 55 is filled with polysilicon (refer to part A in FIG. 6), (2) the configuration in which the groove 55 is filled with SiN (refer to part B in FIG. 6), (3) the configuration in which the groove 55 is not filled with any material (refer to part C in FIG. 6), (4) the configuration in which a Ti layer, a TiN layer, a Ta layer, or a TaN layer is formed on the wall surface of the groove 55 and the inside of the groove 55 is filled with AL or ALCu (refer to part D in FIG. 6), (5) the configuration in which a Ti layer, a TiN layer, a Ta layer, or a TaN layer is formed on the wall surface of the groove 55 and the inside of the groove 55 is filled with Cu (refer to part E in FIG. 6), (6) the configuration in which a Ti layer or a TiN layer is formed on the wall surface of the groove 55 and the inside of the groove 55 is filled with tungsten (refer to part F in FIG. 6), (7) the configuration in which the groove 55 is filled with $SiO_2$ (refer to part G in FIG. 6), and (8) the configuration in which the groove 55 is filled with SiOC which is a material having a low-dielectric constant (refer to part H in FIG. 6).

Here, as for chipping, as the difference between a characteristic (hardness or rigidity modulus) of the chipping prevention wall 53 and that of a film in which chipping occurs is larger, chipping suppressing-force is improved. Here, even in a case where adhesiveness at an interface between the film in which chipping occurs and a filling material is weak, chipping can be sufficiently let away to an upper layer.

Figure 7A:
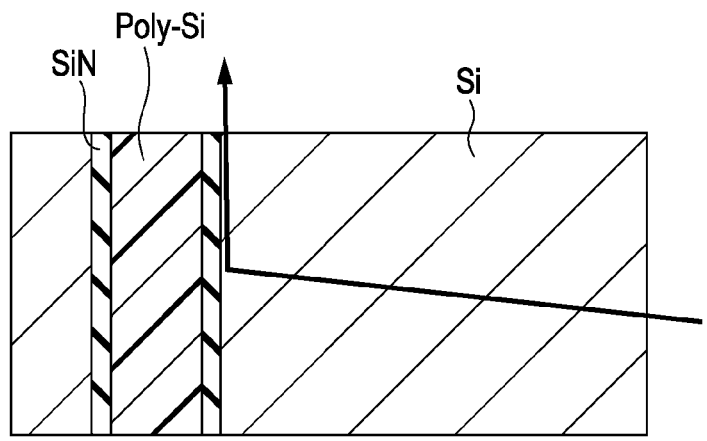
FIGS. 7A to 7C schematically illustrate suppression of chipping by the chipping prevention wall.
Figure 7B:
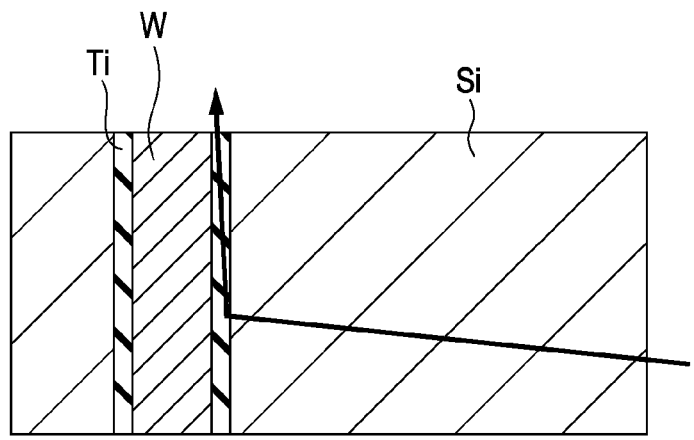
Figure 7C:
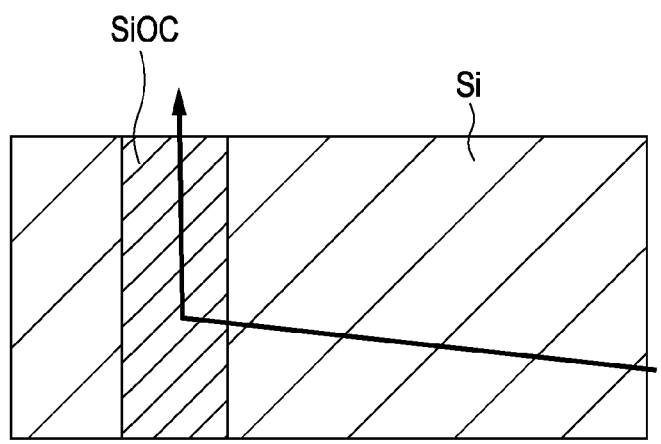

For example, in a case where a SiN layer is formed on the wall surface of the groove 55 and the inside of the groove 55 is filled with polysilicon (in the case of part A of FIG. 6), though adhesiveness at the interface between the film in which chipping occurs and the filling material is weak, the chipping propagates along the interface toward an upper layer (refer to FIG. 7A). Further, in a case where a TiN layer is formed on the wall surface of the groove 55 and the inside of the groove 55 is filled with tungsten (in the case of part F of FIG. 6), a direction of chipping changes at the interface because the filling material is hard (refer to FIG. 7B). Furthermore, in a case where the groove 55 is filled with SiOC (in the case of part H of FIG. 6), the filling material itself breaks because the filling material is soft, and chipping propagates toward the upper layer as a result (refer to FIG. 7C).

Since the chipping prevention wall 53 is exposed from the surface of the semiconductor substrate 32, the chipping prevention wall 53 can serve as an alignment mark.

Here, focusing on a function as an alignment mark, visibility of the mark is high when a difference between reflection ratios of the materials is large. Accordingly, since optical transmittance of silicon is high, it can be considered that the mark has high visibility in the cases of parts A, B, C, G, and H of FIG. 6 described above.

Further, since a reflection ratio of metal is higher than that of silicon, it is considered that the mark has high visibility in the cases of parts D, E, and F of FIG. 6 described above.

Further, in a case where an edge level difference of materials is provided, it is considered that the mark has high visibility. Since the cases of parts A, D, E, and F of FIG. 6 have a bilayer structure, a level difference can be formed, whereby it is considered that the mark has high visibility.

As for the chipping prevention wall 53, the groove 55 may be filled with no material, but the guard ring may be corroded due to moisture absorption when the groove 55 is left open. Therefore, it is preferable that the groove 55 be filled with some sort of material.

Operation of Solid-State Imaging Element

An operation of the solid-state imaging element configured as described above is described below.

First, in a charge accumulation period, light incident from the backside of the semiconductor substrate 32 is photoelectrically converted by the light receiving portion 33 and signal charge corresponding to an amount of the incident light is generated. The signal charge generated by the photoelectric conversion drifts in the charge accumulation region 41 and is accumulated in the vicinity of the hole accumulation region 44, in the charge accumulation region 41.

Here, in the charge accumulation period, a negative voltage is applied to a gate electrode of the transfer transistor 22 and the transfer transistor 22 is in an OFF state.

Next, in reading out, a positive voltage is applied to the gate electrode of the transfer transistor 22 and the transfer transistor 22 is turned to be in an ON state. As a result, the signal charge accumulated in the light receiving portion 33 is transferred to the floating diffusion 45.

Here, in accordance with an amount of the signal charge which is transferred to the floating diffusion 45, a potential of the floating diffusion 45 changes. Then, the potential of the floating diffusion 45 is amplified by the amplification transistor 23 and a voltage corresponding to the potential is outputted to the vertical signal line 27.

Next, in resetting, a positive voltage is applied to a gate electrode of the reset transistor 25, and the floating diffusion 45 is reset to have a voltage of the power source Vdd. At this time, the transfer transistor 22 is turned to be in the OFF state by applying a negative voltage to the gate electrode of the transfer transistor 22.

The charge accumulation period, the reading out operation, and the resetting operation described above are repeatedly performed.

Manufacturing Method

A method for manufacturing a solid-state imaging device configured as described above is described below. That is, an example of a method for manufacturing a solid-state imaging device to which the embodiment of the present invention is applied is described. At the same time, an example of a method for manufacturing a solid-state imaging element to which the embodiment of the present invention is applied is also described.

Figure 8A:
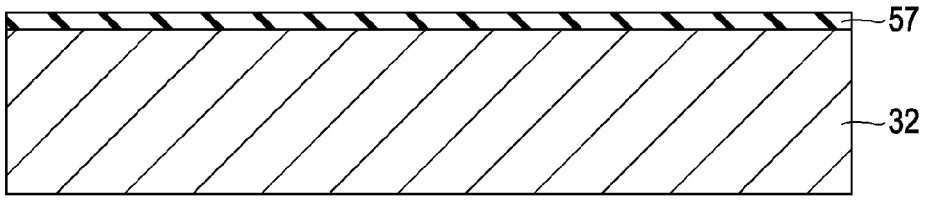
FIGS. 8A to 8D schematically illustrate an example of a method for manufacturing a solid-state imaging device to which the embodiment of the present invention is applied (1)

In the example of the method for manufacturing a solid-state imaging device to which the embodiment of the present invention is applied, as shown in FIG. 8A, an insulation film 57 is first formed to be layered on the semiconductor substrate (n-type silicon substrate) 32 by a surface oxidation method.

Figure 8B:
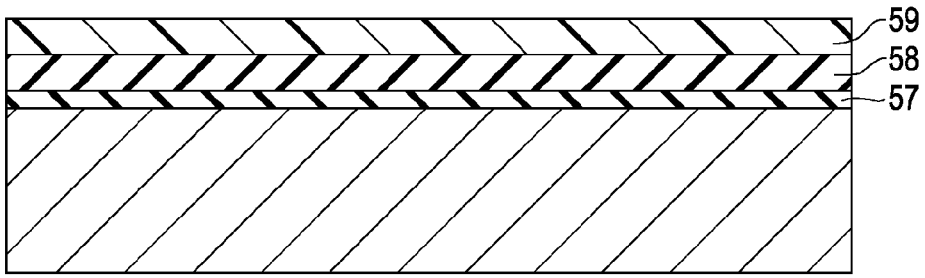

Next, a silicon nitride layer 58, for example, which serves as a hard mask layer is formed to be layered on the insulation film 57 and a resist film 59 is further formed to be layered on the silicon nitride layer 58 (refer to FIG. 8B).

Figure 8C:
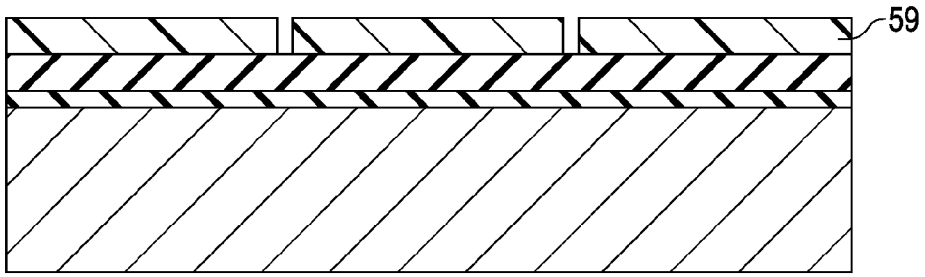

Subsequently, a pattern is formed on the resist film 59 by employing general-purpose photolithography and etching techniques (refer to FIG. 8C).

Figure 8D:
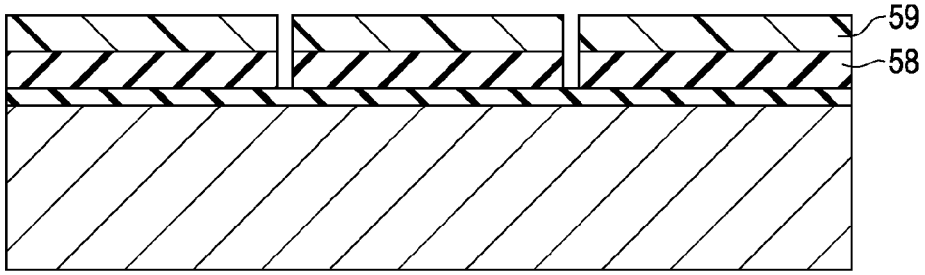

Next, the silicon nitride layer 58 is processed by using the resist film 59 as an etching mask so as to form a pattern of a groove, as shown in FIG. 8D, and then the resist film 59 is removed.

Figure 9E:
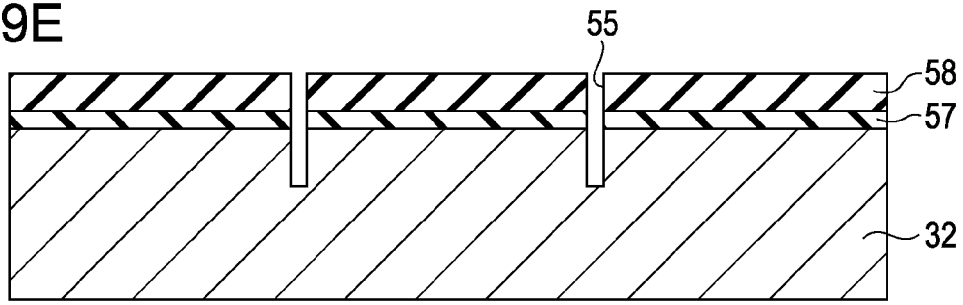
FIGS. 9E to 9H schematically illustrate the example of the method for manufacturing a solid-state imaging device to which the embodiment of the present invention is applied (2)

Subsequently, as shown in FIG. 9E, the insulation film 57 and the semiconductor substrate 32 is remove-processed by using the silicon nitride layer 58, on which the pattern of the groove is formed, as an etching mask so as to form the groove 55 having a bottom in the semiconductor substrate 32.

Here, the groove 55 is formed to have the depth which is larger than the total thickness of the thickness of the pixel portion 12, which is formed in a later-described process, and the thickness of the semiconductor substrate 32 which is left on the pixel portion 12, or is larger than the thickness of the element forming layer 39 in which the pixel portion 12 is formed.

Though the silicon nitride layer 58 is removed at later-described timing in the example of the embodiment, the silicon nitride layer 58 may be removed immediately after the groove 55 having a bottom is formed in the semiconductor substrate 32.

Figure 9F:
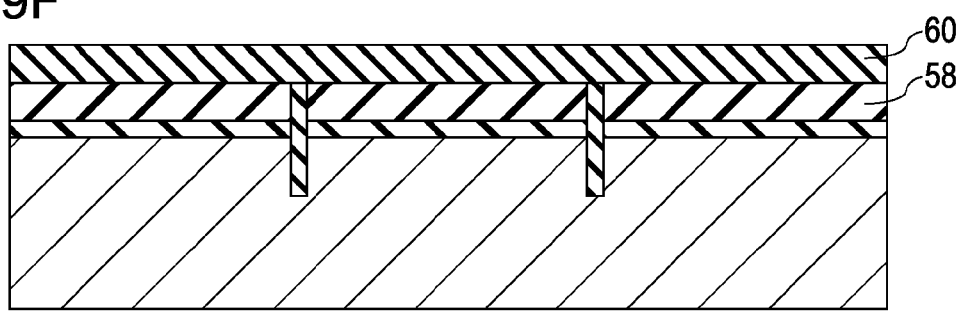

Next, as shown in FIG. 9F, an insulation film 60 is formed on the silicon nitride layer 58 so as to fill the groove 55 with the insulation film 60.

Here, a material of the insulation film 60 is an example of the predetermined material 56.

Figure 9G:
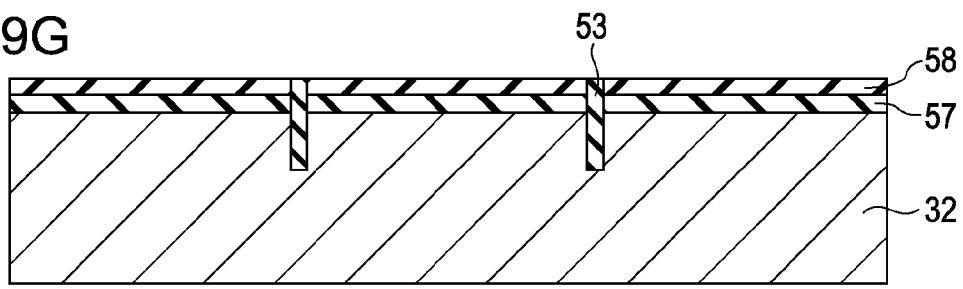

Subsequently, removal processing using chemical-mechanical planarization (CMP) or the like is performed so as to remove the insulation film 60 on the silicon nitride layer 58 (refer to FIG. 9G).

Here, the insulation film 60 inside the groove 55 is not removed even by the removal processing to be left in the groove 55, and therefore the chipping prevention wall 53 can be formed.

Figure 9H:
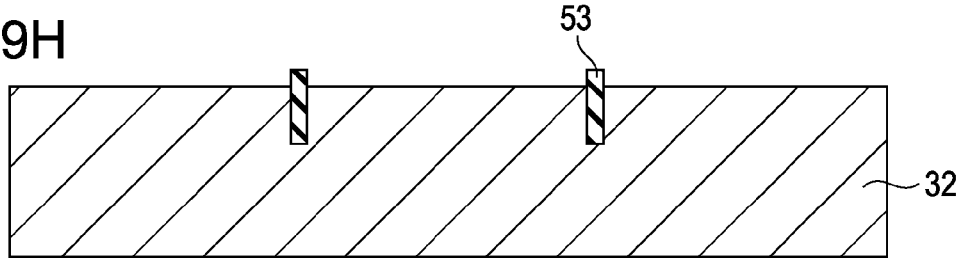

Next, as shown in FIG. 9H, the silicon nitride layer 58 and the insulation film 57 are removed by wet etching processing.

By removing the silicon nitride layer 58 and the insulation film 57, the insulation film 60 protrudes from the surface of the semiconductor substrate 32.

Figure 10I:
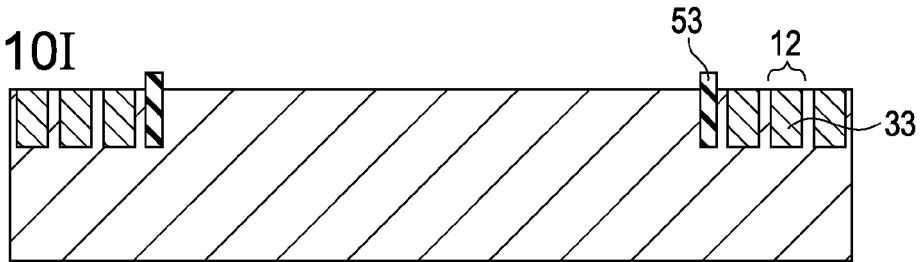
FIGS. 10I to 10K schematically illustrate the example of the method for manufacturing a solid-state imaging device to which the embodiment of the present invention is applied (3)

Subsequently, as shown in FIG. 10I, the pixel portion 12 including the light receiving portion 33 which is a photoelectric conversion portion is formed by a general-purpose pixel portion forming technique. Here, the light receiving portion 33 is formed to be shallower than the chipping prevention wall 53.

As an example of a forming method of the pixel portion 12, the element isolation insulation film 40 is first formed by a shallow trench isolation (STI) technique. Subsequently, the n-type charge accumulation region 41, the p-type well 42, the p-type hole accumulation region 44, the floating diffusion 45, and the p-type region 46 are formed by an ion implantation method. A forming order of these regions is not specifically limited.

Figure 10J:
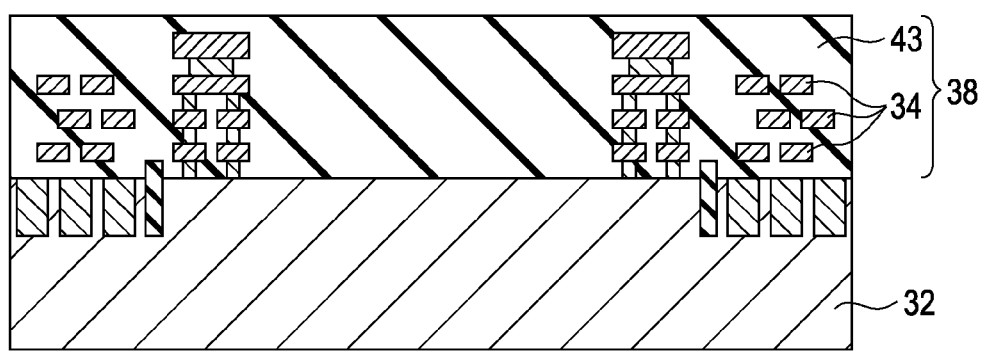

Next, as shown in FIG. 10J, formation of the insulation film 43 and formation of the wiring 34 are repeatedly performed on the surface of the semiconductor substrate 32 so as to form the wiring layer 38. In addition, the guard ring 54 is formed simultaneously with the wiring layer 38.

Figure 10K:
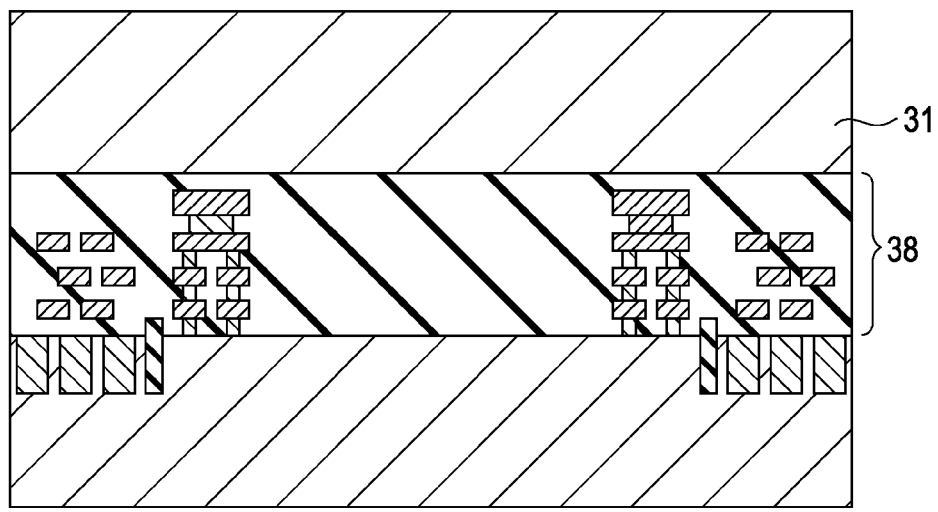

Subsequently, the semiconductor support substrate 31 made of silicon is bonded to the wiring layer 38 with a silicon dioxide layer (not shown) interposed (refer to FIG. 10K).

Figure 11L:
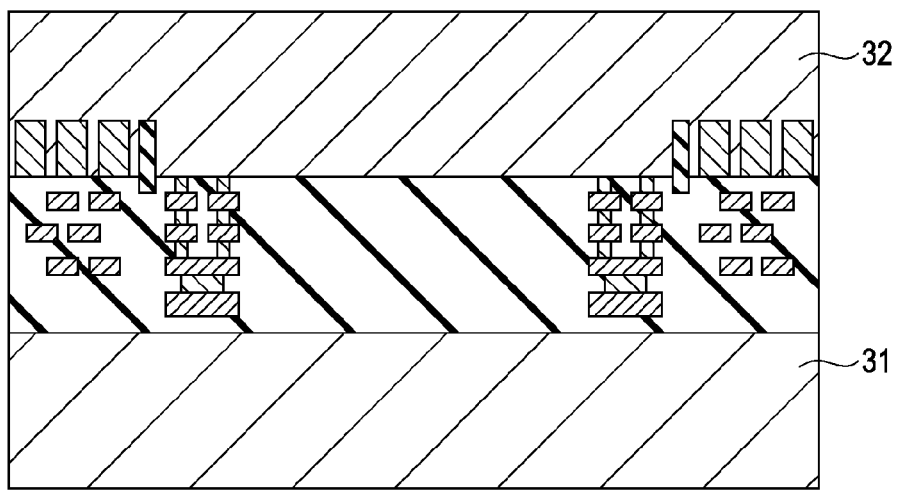
FIGS. 11L to 11N schematically illustrate the example of the method for manufacturing a solid-state imaging device to which the embodiment of the present invention is applied (4)

Then, as shown in FIG. 11L, the semiconductor substrate 32 to which the semiconductor support substrate 31 is bonded is inverted so as to position the semiconductor substrate 32 which is a polishing object at the upper surface side.

Figure 11M:
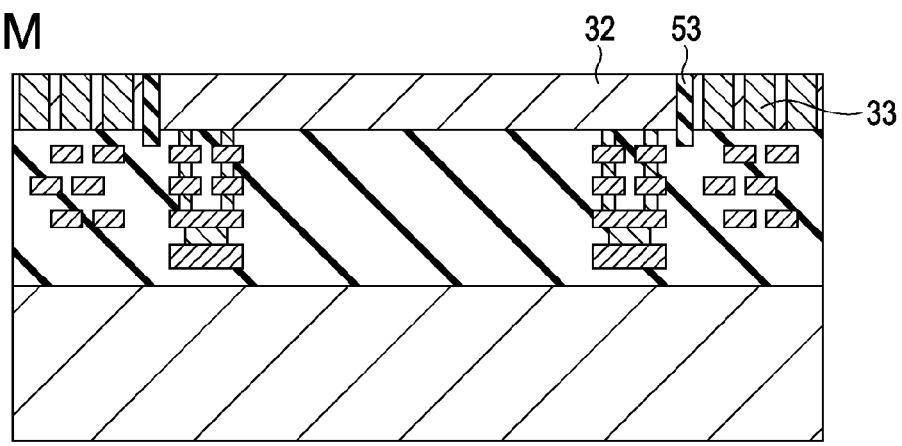

Next, as shown in FIG. 11M, removal processing by grinding and polishing the semiconductor substrate 32 is performed until the chipping prevention wall 53 is exposed. The surface of the semiconductor substrate 32 is finally processed to be smooth and flat by chemical mechanical polishing.

Here, in the removal processing of the embodiment, as the removal of the semiconductor substrate 32 is progressed, the chipping prevention wall 53 is exposed. The exposure of the chipping prevention wall 53 enables detection of an end point of the backside grinding.

Further, since the light receiving portion 33 is formed shallower than the chipping prevention wall 53 in the above-described process (since the semiconductor substrate 32 is inverted, the light receiving portion 33 is formed shorter, in this case), the removal processing does not affect the light receiving portion 33.

Figure 11N:
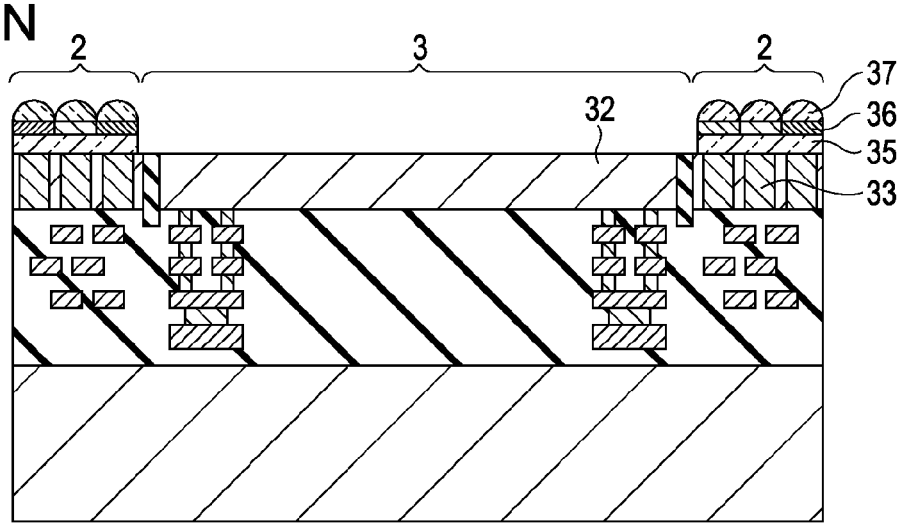

Next, a light-blocking film (not shown) is formed on the backside of the semiconductor substrate 32 and pattern processing is performed so as to form a visible light introduction opening in a region which corresponds to the light receiving portion 33. Further, the passivation film 35 having a light transmission property is formed on the light-blocking film by the CVD method and the color filter 36 and the micro-lens 37 are formed. Thus, the solid-state imaging device shown in FIG. 11N can be obtained.

The semiconductor substrate 32 of a wafer level is diced at the scribe line 3 to be divided into individual chips and these chips are respectively mounted, bonded, and encapsulated, thereby being configured as individual solid-state imaging elements.

Since the chipping prevention wall 53 is formed in the solid-state imaging device to which the embodiment of the present invention is applied, chipping can be prevented from reaching the solid-state imaging element in the dicing with a blade and thus yield degradation of the dicing can be suppressed.

Figure 17A:
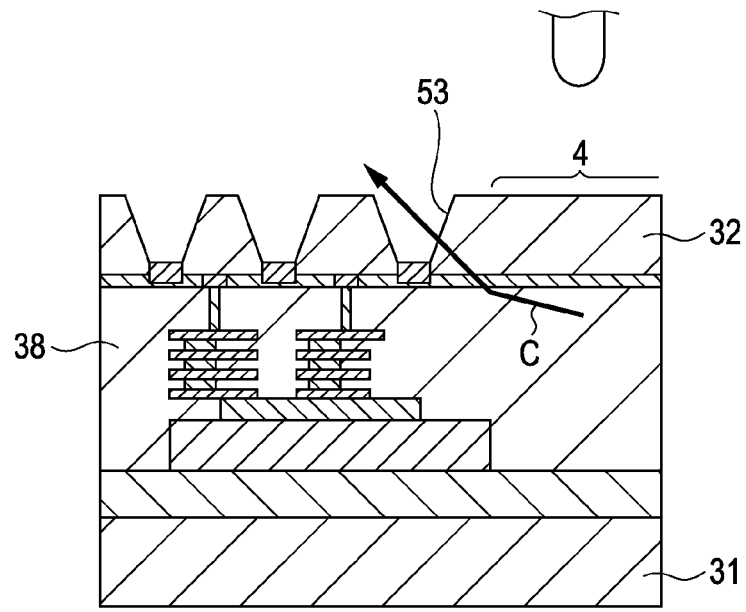
FIGS. 17A and 17B schematically illustrate an advantageous effect of the embodiments of the present invention.

That is, as shown in FIG. 17A, when chipping C propagating at an interface between the semiconductor substrate 32 and the wiring layer 38 reaches the chipping prevention wall 53, the propagating direction changes, namely, the chipping C can be let away to an upper layer. Accordingly, the chipping C can be prevented from reaching the solid-state imaging element.

Further, the guard ring 54 is positioned closer to the blade region than the chipping prevention wall 53 in the solid-state imaging device to which the embodiment of the present invention is applied, so that it can be expected that chipping propagating inside the wiring layer 38 is extremely efficiently suppressed.

Figure 17B:
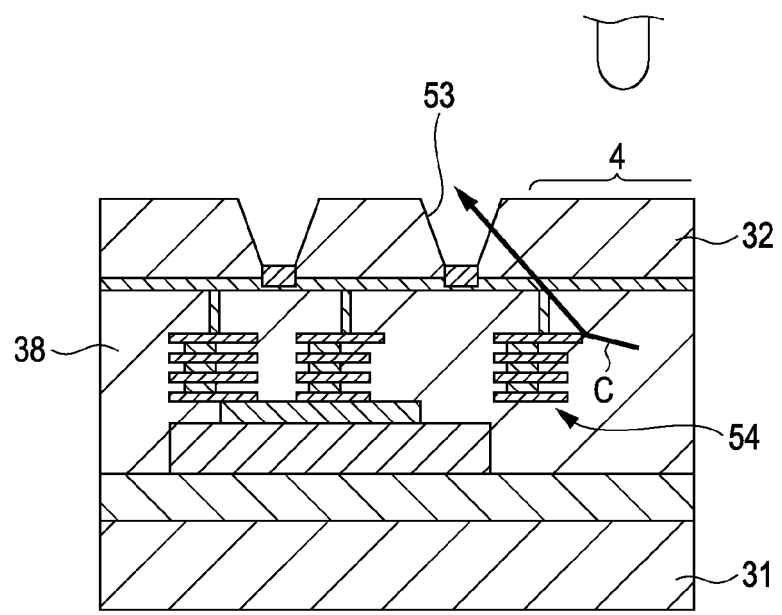

That is, as shown in FIG. 17B, it is considered that the chipping C which reaches the guard ring 54 changes its propagating direction to the semiconductor substrate 32 side and propagates at the interface between the semiconductor substrate 32 and the wiring layer 38. Therefore, by positioning the guard ring 54 closer to the blade region than the chipping prevention wall 53, the chipping C after changing its propagating direction can be also suppressed at the chipping prevention wall 53.

2. Another Embodiment

Configuration of Semiconductor Device

Figure 12:
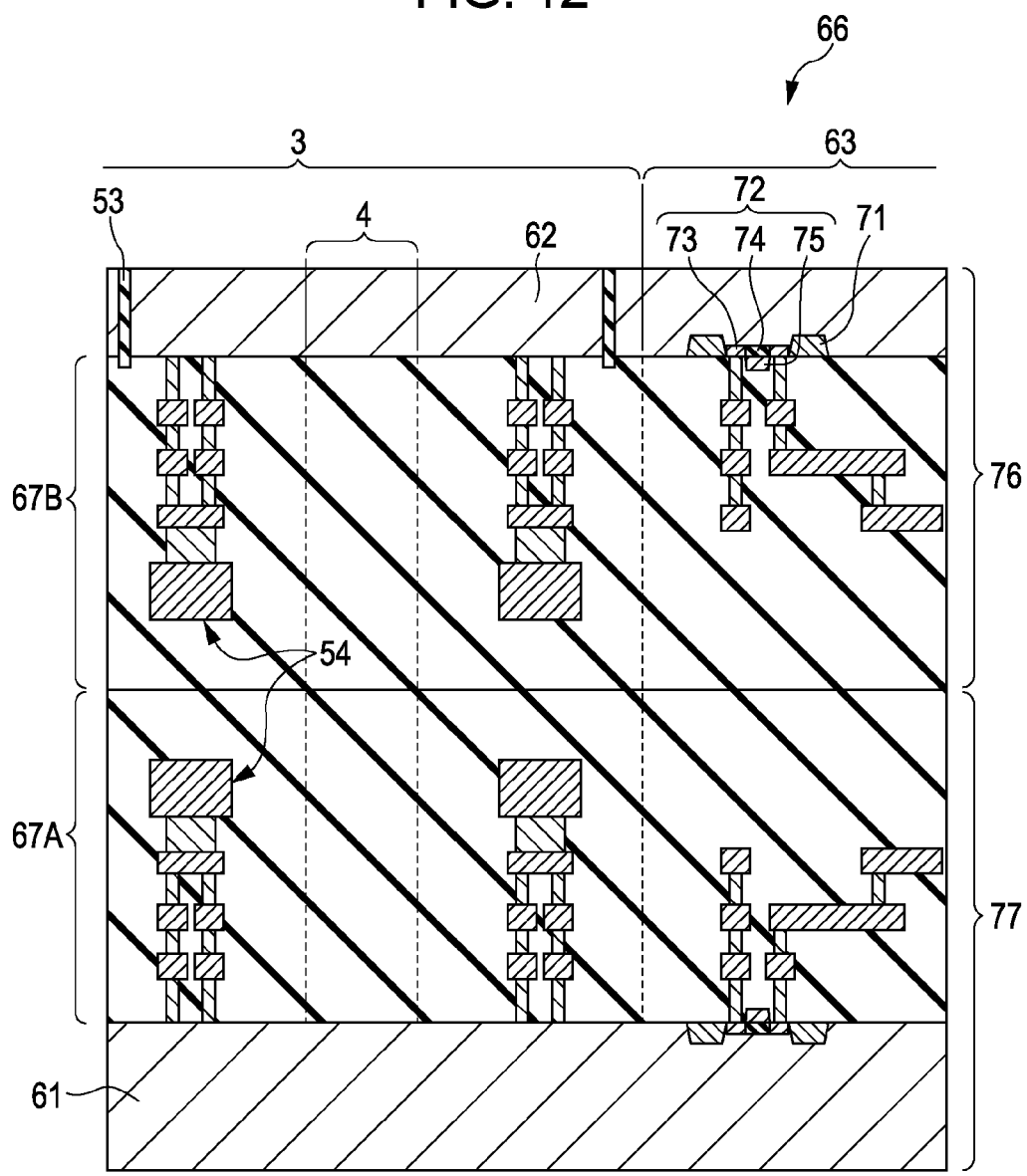
FIG. 12 is a sectional view schematically illustrating an example of a semiconductor device to which another embodiment of the present invention is applied.

FIG. 12 is a sectional view schematically illustrating an example of a semiconductor device to which another embodiment of the present invention is applied. In a semiconductor device 66 shown in FIG. 12, a plurality of semiconductor elements (semiconductor chips) 63 are formed and the scribe line 3 is provided at a gap between the semiconductor elements 63. Further, the blade region 4 is provided in the scribe line 3.

The semiconductor element 63 is chiefly composed of a semiconductor support substrate 61, a semiconductor substrate 62, and a wiring layer 67. The wiring layer 67 is composed of a wiring layer 67A and a wiring layer 67B.

The semiconductor support substrate 61 is made of n-type silicon. The semiconductor support substrate 61 includes an element forming layer in which devices such as a logic element, an active element, and a passive element (metal-oxide-semiconductor field-effect transistor (MOSFET), for example) are formed.

On one surface of the semiconductor support substrate 61, the wiring layer 67A which performs electrical-wiring with respect to the devices in a multilayer fashion is formed.

In a similar manner, the semiconductor substrate 62 is also made of n-type silicon. Further, the semiconductor substrate 62 also includes an element forming layer in which devices such as a logic element, an active element, and a light-receiving element (metal-oxide-semiconductor field-effect transistor (MOSFET), for example) are formed.

Further, on one surface of the semiconductor substrate 62, the wiring layer 67B which performs electrical-wiring with respect to the devices in a multilayer fashion is formed.

The wiring layer 67A and the wiring layer 67B are bonded to each other with an adhesive (not shown).

Here, in a gap between the semiconductor elements 63 adjacent to each other in the semiconductor substrate 62, the scribe line 3 which is to be a region for cutting out each of the semiconductor elements 63 is formed and the chipping prevention wall 53 and the guard ring 54 are formed in the scribe line 3 (refer to FIG. 12).

Specifically, in the semiconductor substrate 62, the chipping prevention walls 53 are formed at both sides of the blade region 4 in the scribe line 3. Further, in the wiring layer 67B, the guard rings 54 are formed at both sides of the blade region 4 in the scribe line 3.

Further, in the wiring layer 67A as well, the guard rings 54 are formed at both sides of the blade region 4 in the scribe line 3.

The width of the scribe line 3 is determined depending on the width of the blade region 4, the width of the guard ring 54, and the width of the chipping prevention wall 53, and is about 50 μm to 200 μm. The width of the blade region 4 is determined in consideration of the blade width and variation of a blade so as to be set to be about 30 μm to 80 μm.

The guard ring 54 is simultaneously formed in a forming process of the wiring layers 67A and 67B of the semiconductor element 63 and is principally made of the same material (aluminum, copper, tungsten, or the like, for example) as that of the wiring. The guard ring 54 functions to suppress chipping propagating inside the wiring layers 67A and 67B and to suppress moisture absorption from a wall of the semiconductor chip side, and the width thereof is set to be about 3 μm to 20 μm.

The chipping prevention wall 53 is formed such that a groove is formed in a manner to penetrate through the element forming layer and the groove is filled with a predetermined material (for example, an insulation film, a conductive film, or a layered film composed of an insulation film and a conductive film), for example. Alternatively, the whole inside of the groove may be a hollow (that is, the groove is filled with nothing) or a part of the groove may be filled with a predetermined material as is the case with the embodiment described earlier.

Manufacturing Method

A method for manufacturing a semiconductor device which is configured as described above is described below. That is, an example of a method for manufacturing a semiconductor device to which the other embodiment of the present invention is applied is described.

Figure 13A:
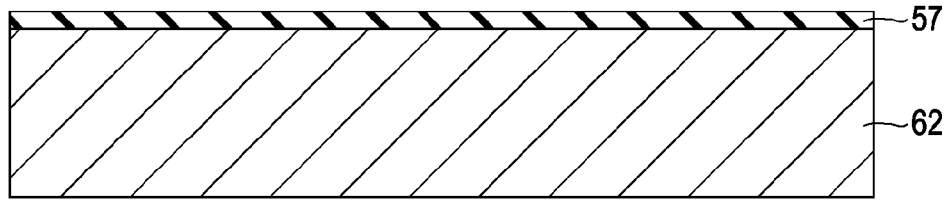
FIGS. 13A to 13D schematically illustrate an example of a method for manufacturing a semiconductor device to which the other embodiment of the present invention is applied (1)

In the example of the method for manufacturing a semiconductor device to which the other embodiment of the present invention is applied, as shown in FIG. 13A, the insulation film 57 is first formed to be layered on the semiconductor substrate (n-type silicon substrate) 62 by the surface oxidation method.

Figure 13B:
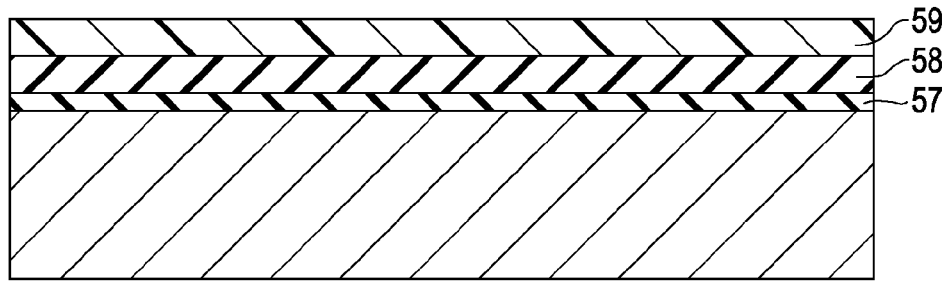

Next, the silicon nitride layer 58, for example, which serves as a hard mask layer is formed to be layered on the insulation film 57 and the resist film 59 is further formed to be layered on the silicon nitride layer 58 (refer to FIG. 13B).

Figure 13C:
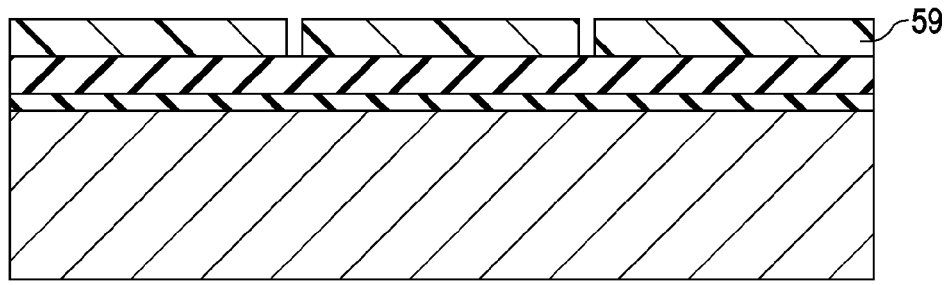

Subsequently, a pattern is formed on the resist film 59 by employing general-purpose photolithography and etching techniques (refer to FIG. 13C).

Figure 13D:
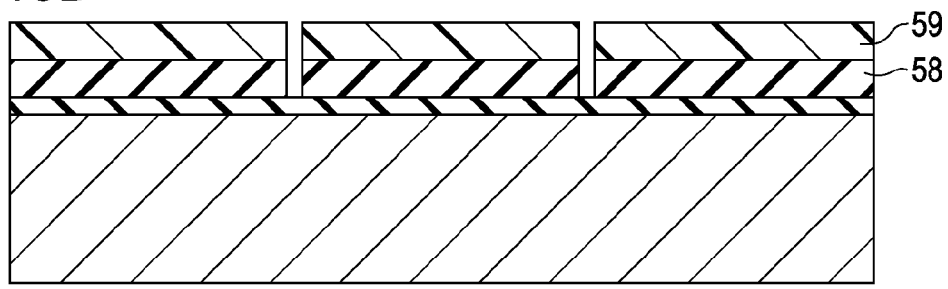

Next, the silicon nitride layer 58 is processed by using the resist film 59 as an etching mask so as to form a pattern of a groove, as shown in FIG. 13D, and then the resist film 59 is removed.

Figure 14E:
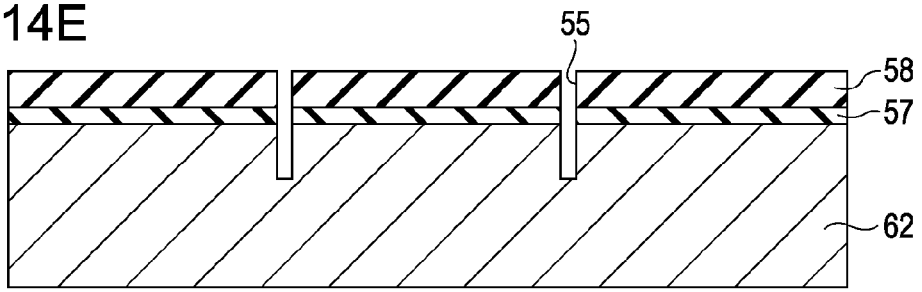
FIGS. 14E to 14H schematically illustrate the example of the method for manufacturing a semiconductor device to which the other embodiment of the present invention is applied (2)

Subsequently, as shown in FIG. 14E, the insulation film 57 and the semiconductor substrate 62 are remove-processed by using the silicon nitride layer 58, on which the pattern of the groove is formed, as an etching mask so as to form the groove 55 having a bottom in the semiconductor substrate 62.

Here, the groove 55 is formed to have the depth which is same as the thickness of the semiconductor substrate 62 after thinned.

Though the silicon nitride layer 58 is removed at later-described timing in the example of the other embodiment, the silicon nitride layer 58 may be removed immediately after the groove 55 having a bottom is formed in the semiconductor substrate 62.

Figure 14F:
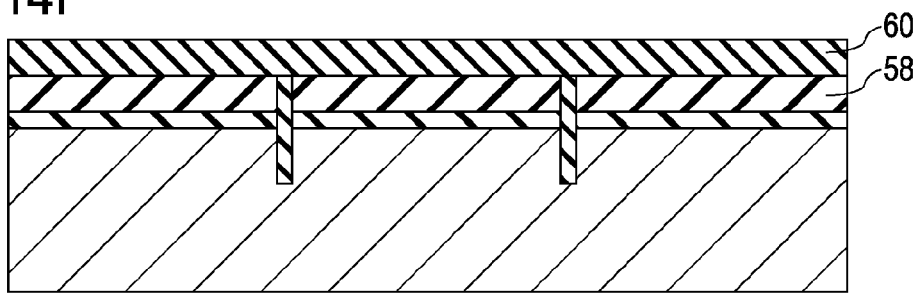

Next, as shown in FIG. 14F, the insulation film 60 is formed on the silicon nitride layer 58 so as to fill the groove 55 with the insulation film 60.

Figure 14G:
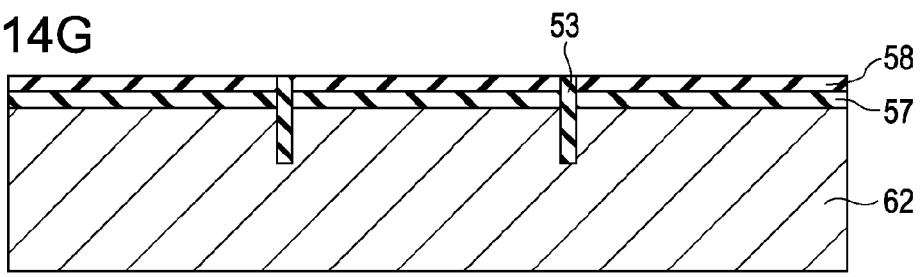

Subsequently, removal processing using chemical-mechanical planarization (CMP) or the like is performed so as to remove the insulation film 60 on the silicon nitride layer 58 (refer to FIG. 14G).

Here, the insulation film 60 inside the groove 55 is not removed even by the removal processing to be left in the groove 55, and therefore the chipping prevention wall 53 can be formed.

Figure 14H:
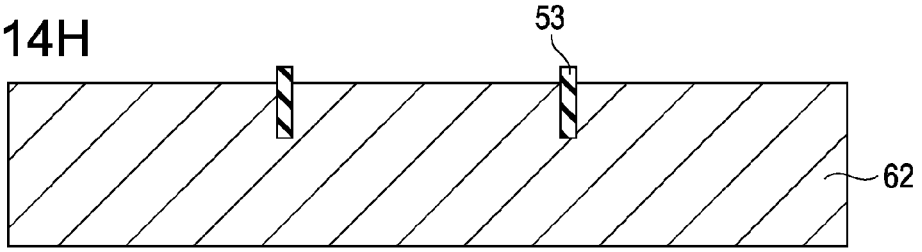

Next, as shown in FIG. 14H, the silicon nitride layer 58 and the insulation film 57 are removed by wet etching processing.

By removing the silicon nitride layer 58 and the insulation film 57, the insulation film 60 protrudes from the surface of the semiconductor substrate 62.

Subsequently, an element isolation region 71 is formed on the surface of the semiconductor substrate 62. Specifically, an isolation groove is formed on the surface of the semiconductor substrate 62, and then the isolation groove is filled with an insulation film made of silicon oxide, for example, so as to form the element isolation region 71. By this element isolation region 71, an active region on the surface of the semiconductor substrate 62 is defined.

Next, a MOSFET 72, for example, is formed in the active region surrounded by the element isolation region 71. The MOSFET 72 is composed of a source/drain region 73, a gate insulation film 74, and a gate electrode 75.

Here, the source/drain region 73 is formed by ion-implanting a desired impurity (phosphorus (P) or arsenic (As), for example, when the MOSFET 72 is an n channel type MOSFET, or boron (B) when the MOSFET 72 is a p channel type MOSFET) in the semiconductor substrate 62. The gate insulation film 74 is made of silicon oxide, for example, and is formed on the surface of the semiconductor substrate 62. In addition, the gate electrode 75 is made of polysilicon having low resistance, for example, and is formed on the gate insulation film 74.

Figure 15I:
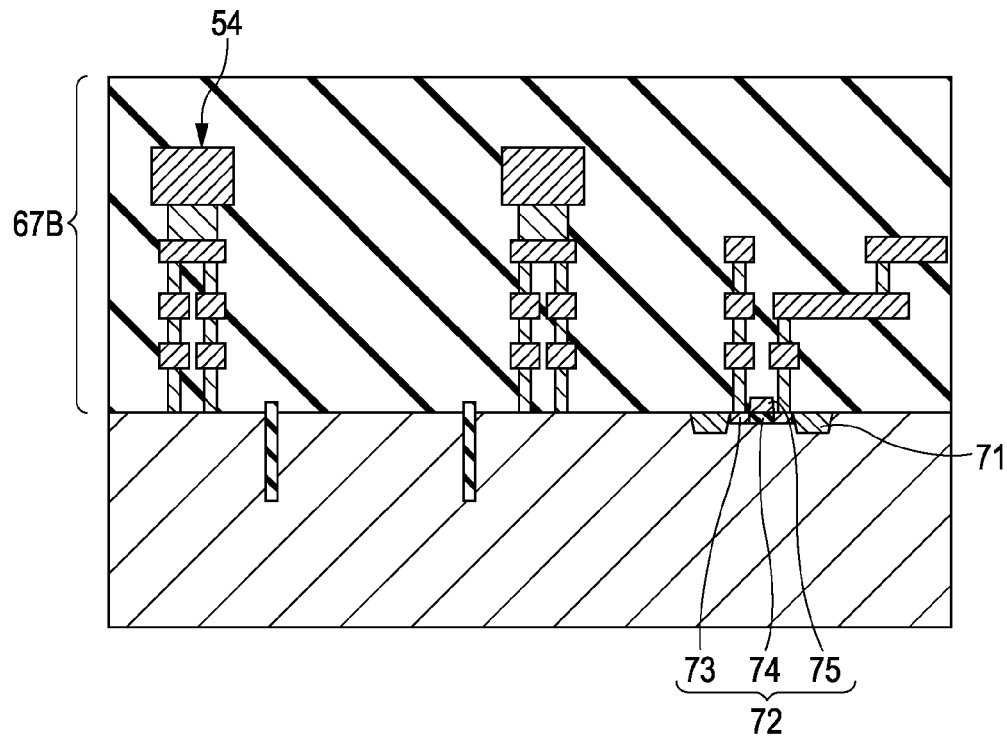
FIGS. 15I and 15J schematically illustrate the example of the method for manufacturing a semiconductor device to which the other embodiment of the present invention is applied (3)

Subsequently, formation of an insulation film and formation of a wiring are repeatedly performed on the surface of the semiconductor substrate 62 so as to form the wiring layer 67B. The guard ring 54 is formed simultaneously with the wiring layer 67B (refer to FIG. 15I).

Hereinafter, a substrate obtained as above is referred to as a bonded substrate 76. Namely, the semiconductor substrate 62 on which the wiring layer 67B is formed is referred to as the bonded substrate 76 for convenience of the description.

Figure 15J:
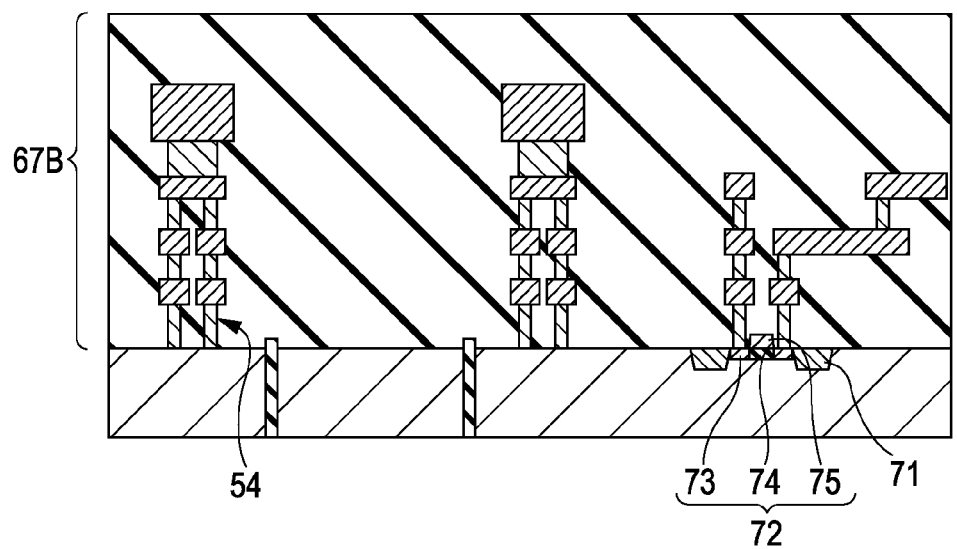

Subsequently, as shown in FIG. 15J, removal processing by grinding and polishing the semiconductor substrate 62 is performed on the bonded substrate 76 until the chipping prevention wall 53 is exposed. The surface of the semiconductor substrate 62 is finally processed to be smooth and flat by chemical mechanical polishing.

The exposure of the chipping prevention wall 53 enables detection of an end point of backside grinding, as is the case with the embodiment described earlier.

Figure 16K:
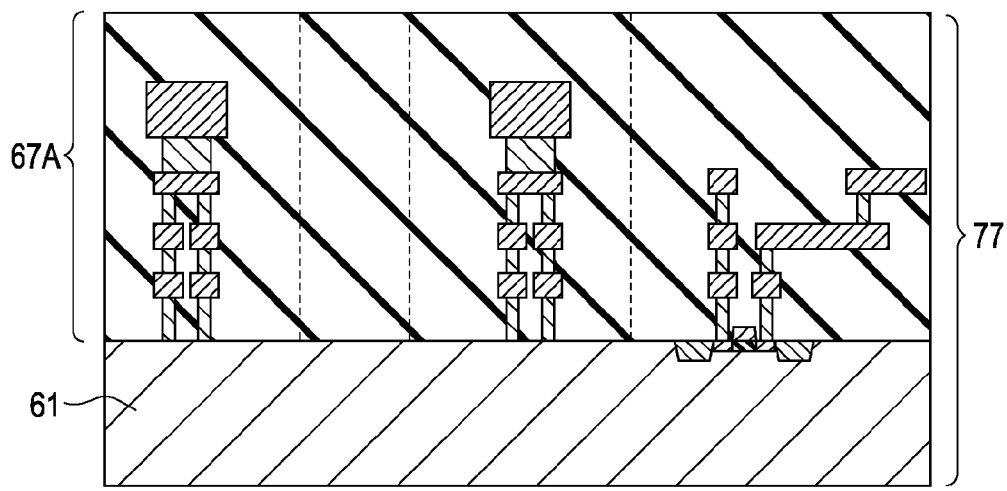
FIGS. 16K and 16L schematically illustrate the example of the method for manufacturing a semiconductor device to which the other embodiment of the present invention is applied (4)

Next, a bonded support substrate 77 shown in FIG. 16K is manufactured by the same process as the manufacturing process of the bonded substrate 76. However, the manufacturing of the bonded support substrate 77 does not include the forming process of the chipping prevention wall 53.

Figure 16L:
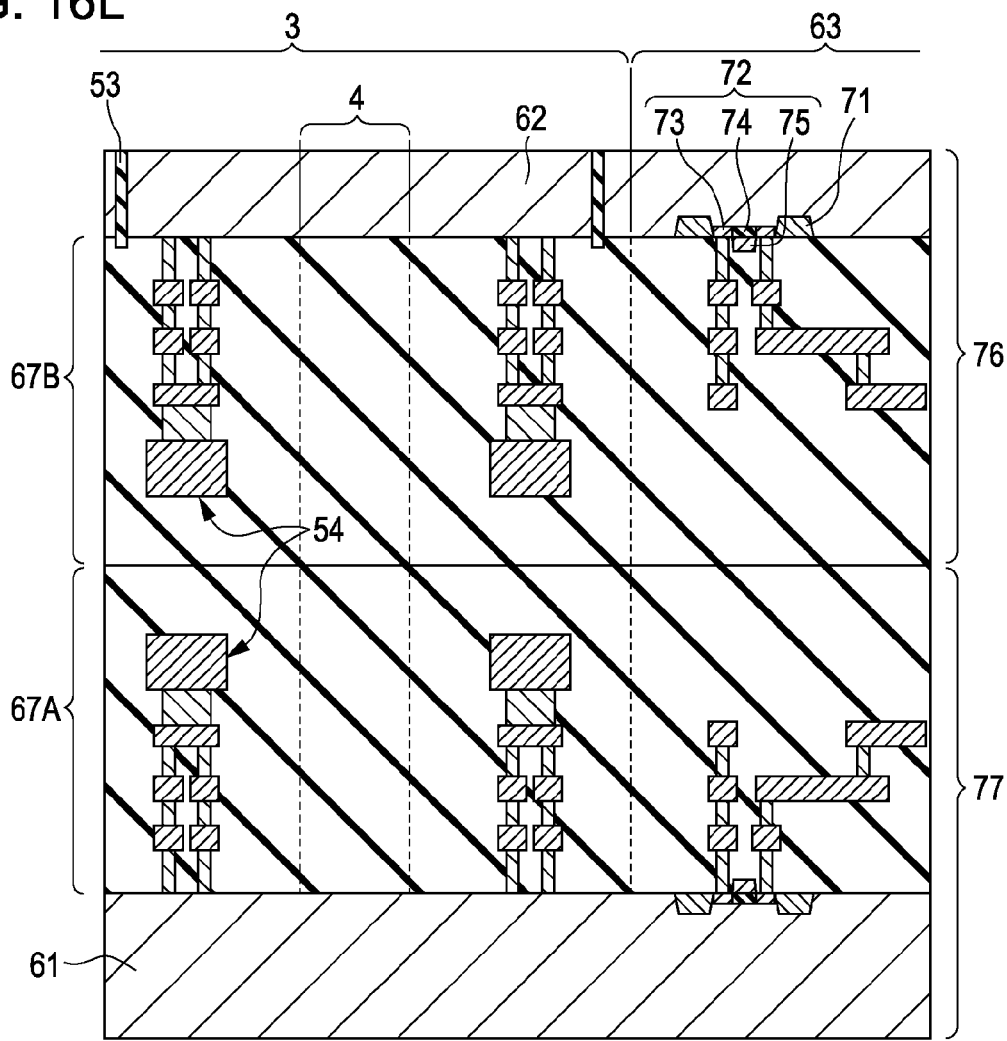

After that, the bonded substrate 76 and the bonded support substrate 77 are heated and bonded with an adhesive (not shown), for example, as shown in FIG. 16L. Thus, a semiconductor device shown in FIG. 12 can be obtained.

Examples of a material of the adhesive include epoxy, a dry film, benzo-cyclo-butene (BCB), polyimide, UV cured resin, and the like.

The semiconductor substrate 62 of a wafer level is diced at the scribe line 3 to be divided into individual chips and these chips are respectively mounted, bonded, and encapsulated, thereby being configured as individual solid-state imaging elements.

Since the chipping prevention wall 53 is formed in the solid-state imaging device to which the other embodiment of the present invention is applied, chipping can be prevented from reaching the solid-state imaging element in the dicing with a blade and thus yield degradation of the dicing can be suppressed.

That is, when chipping C propagating at an interface between the semiconductor substrate 62 and the wiring layer 67B reaches the chipping prevention wall 53, the propagating direction changes, namely, the chipping C can be let away to an upper layer. Accordingly, the chipping C can be prevented from reaching the solid-state imaging element (refer to FIG. 17A).

Further, the guard ring 54 is positioned closer to the blade region than the chipping prevention wall 53 in the solid-state imaging device to which the other embodiment of the present invention is applied, so that it can be expected that chipping propagating inside the wiring layers 67A and 67B is extremely efficiently suppressed.

That is, it is considered that the chipping C which reaches the guard ring 54 changes its propagating direction to the semiconductor substrate 62 side and propagates at the interface between the semiconductor substrate 62 and the wiring layer 67B. Therefore, by positioning the guard ring 54 closer to the blade region than the chipping prevention wall 53, the chipping C after changing its propagating direction can be also suppressed at the chipping prevention wall 53 (refer to FIG. 17B).

3. Modification

About Guard Ring

In the examples of the embodiments described above, not only the chipping prevention wall 53 but also the guard ring 54 are formed.

However, if improvement of the dicing yield can be sufficiently realized by suppressing chipping at an interface between the semiconductor substrate and the wiring layer by the chipping prevention wall 53, the guard ring 54 is not necessarily demanded to be formed.

However, it is considered that the formation of the guard ring 54 enables suppression of chipping propagating inside the wiring layer and can realize further improvement of the dicing yield. Therefore, the guard ring 54 is preferably formed as well.

About Positional Relationship Between Chipping Prevention Wall and Guard Ring

In the examples of the embodiments described above, the guard rings 54 are formed at the both sides of the blade region 4 and the chipping prevention walls 53 are formed at the outside of the guard rings 54.

However, any positional relationship is available as long as chipping propagation to the solid-state imaging element and the semiconductor element can be suppressed. The chipping prevention walls 53 may be formed at the both sides of the blade region 4 and the guard rings 54 may be formed at the outside of the chipping prevention walls 53.

However, the above-described positional relationship is preferable so as to efficiently suppress chipping which reaches the guard ring 54, changes its propagating direction, and propagates at the interface between the semiconductor substrate and the wiring layer, as well. That is, it is preferable that the guard rings 54 be formed at the both sides of the blade region 4 and the chipping prevention walls 53 be formed at the outside of the guard rings 54.

About Number of Chipping Prevention Walls and Guard Rings

In the examples of the embodiments described above, a single chipping prevention wall 53 is formed between the blade region 4 and the semiconductor chip. However, when a plurality of chipping prevention walls and guard rings are formed, chipping suppressing-effect can be improved.

On the other hand, when the number of formed chipping prevention walls and guard rings is increased, the scribe line 3 may be disadvantageously enlarged beyond necessity.

Therefore, though the number of the chipping prevention walls 53 and the guard rings 54 is not especially limited, the number should be determined depending on a region of the scribe line 3.

About Forming Region of Guard Ring

In the example of the embodiment described first, the guard ring is formed in the almost whole region of the wiring layer. On the other hand, in the example of the embodiment described second, the guard ring is not formed in a part of the region at the semiconductor support substrate side in the wiring layer 67A and in a part of the region at the semiconductor substrate side in the wiring layer 67B.

Here, the guard ring is preferably formed in the almost whole region of the wiring layer from the viewpoint of the suppression of chipping, but the guard ring is not necessarily demanded to be formed in the whole region of the wiring layer.

About Color Filter

In the example of the embodiment described first, the color filter 36 having the RGB Bayer arrangement is used. However, an organic photoelectric conversion film may be used so as to improve color reproducibility and realize the solid-state imaging element 2 having high fineness.

Figure 18:
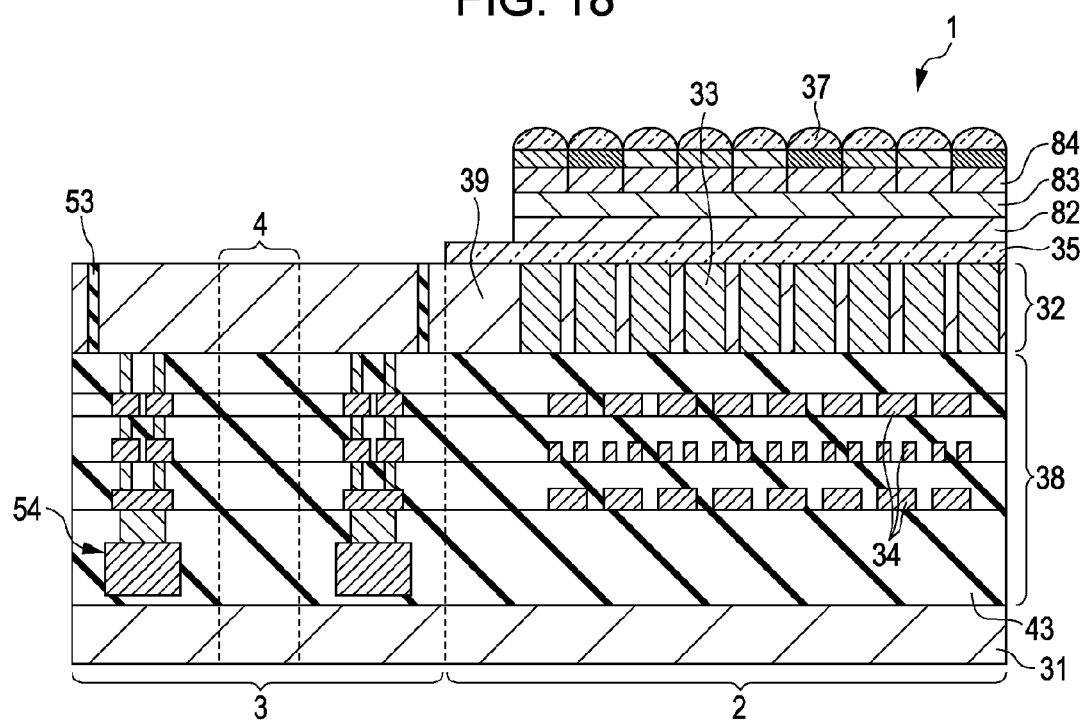
FIG. 18 schematically illustrates a modification of the embodiment described first.

FIG. 18 schematically illustrates a modification of the embodiment described first. In the solid-state imaging element 2 shown in FIG. 18, organic photoelectric conversion films 82 are formed to be layered on the passivation film 35 and organic color filter layers 84 are further formed on the organic photoelectric conversion film 82 with an isolation layer 83 interposed.

The organic color filter layers 84 are formed to correspond to the light receiving portions 33. For example, in order to take out blue (B) and red (R), the organic color filter layers 84 are formed such that cyan organic color filter layers 84C and yellow organic color filter layers 84Y are arranged checkerwise. Further, the micro-lens 37 focusing incident light on each of the light receiving portions 33 is formed on each of the organic color filter layers 84.

Examples of green (G) coloring matters of the organic photoelectric conversion films 82 include a rhodamine coloring matter, a phthalocyanine derivative, quinacridone, eosin-Y, and Methine Dyes represented by merocyanine and their Derivatives.

The solid-state imaging device 1 of the modification takes out a green (G) signal from the organic photoelectric conversion films 82, and takes out blue (B) and red (R) from a combination of cyan and yellow organic color filter layers 84.

An example of a planar arrangement (coding) of the organic photoelectric conversion films 82 and a planar arrangement of the organic color filter layers 84 is described below with reference to FIGS. 19A and 19B.

Figure 19A:
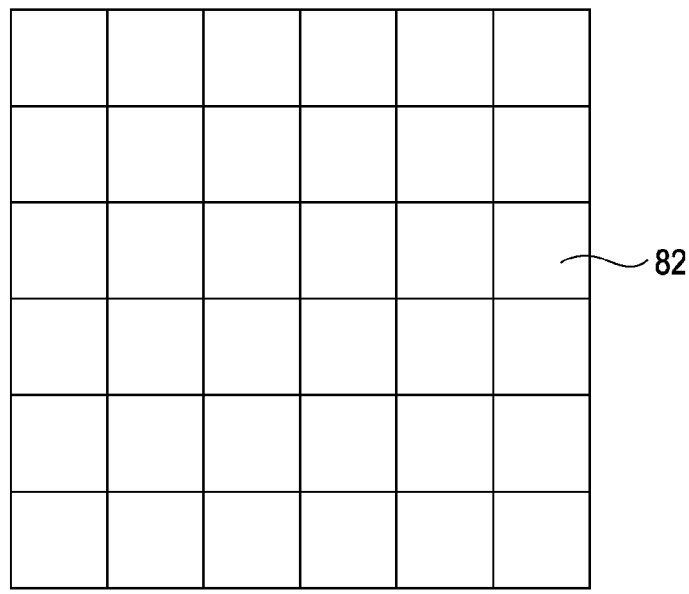
FIGS. 19A and 19B schematically illustrate an example of a planar arrangement (coding) of organic photoelectric conversion films and a planar arrangement of organic color filter layers.
Figure 19B:
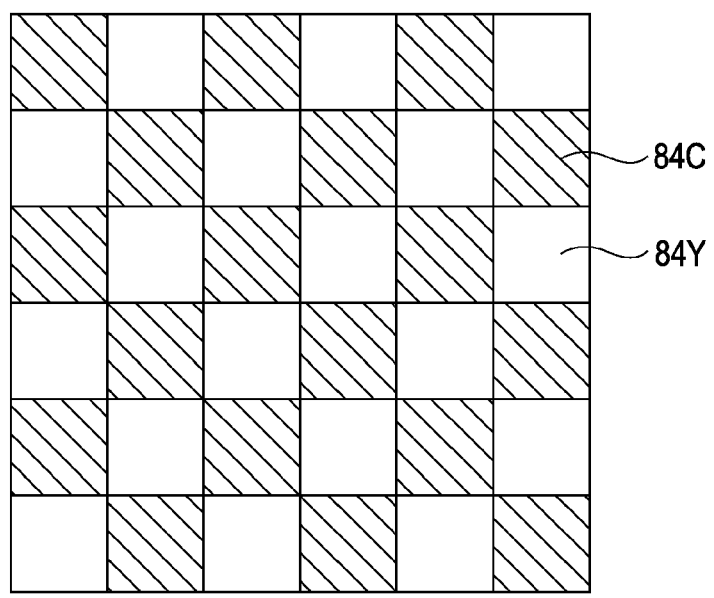
Figure 20:
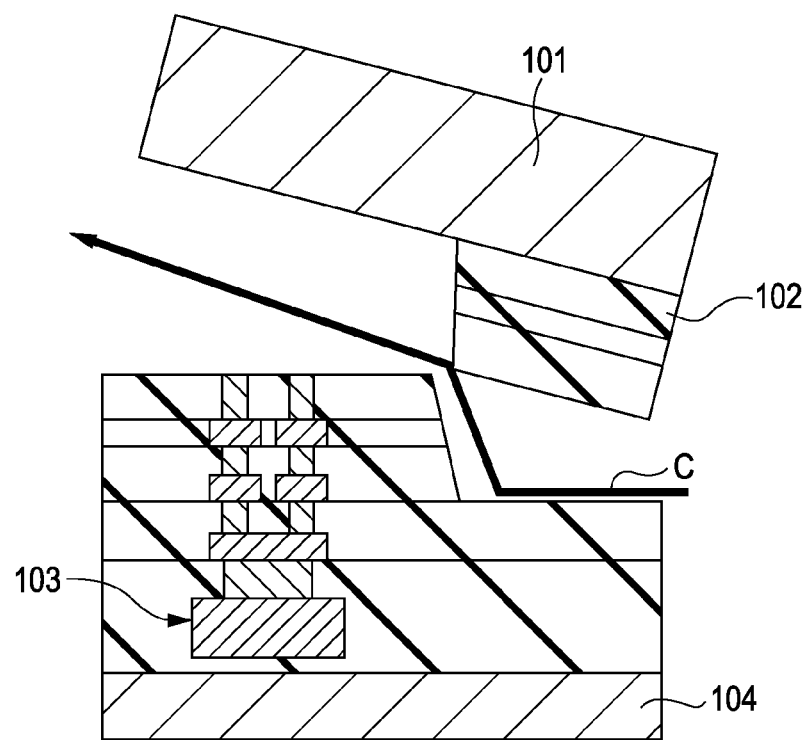
FIG. 20 schematically illustrates chipping propagation.

As shown in FIG. 19A, the organic photoelectric conversion films 82 for taking out green (G) are arranged in all pixels. As shown in FIG. 19B, the cyan and yellow organic color filter layers 84 are arranged checkerwise. Light division into blue (B) and red (R) components is attained by the following principle.

That is, in taking out blue (B), a red (R) component is removed by absorption by the cyan organic color filter layer 84C, a green (G) component is subsequently removed by absorption by the green (G) organic photoelectric conversion film 82, and thus blue (B) can be taken out by a blue (B) component which is left.

On the other hand, in taking out red (R), a blue (B) component is removed by absorption by the yellow organic color filter layer 84Y, a green (G) component is subsequently removed by absorption by the green (G) organic photoelectric conversion film 82, and thus red (R) can be taken out by a red (R) component which is left.

By the above described configuration, separate color signals of green (G), blue (B), and red (R) can be outputted.

Here, the cyan organic color filter layers 84C and the yellow organic color filter layers 84Y are arranged in a so-called checked arrangement, so that spatial luminance and chroma resolution are slightly degraded. However, color reproducibility can be significantly improved.

The present application contains subject matter related to that disclosed in Japanese Priority Patent Application JP 2009-271280 filed in the Japan Patent Office on Nov. 30, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
   a semiconductor substrate configured to include a solid-state imaging element that is provided with a photoelectric conversion region, and a scribe line region that is provided along a periphery of the solid-state imaging element;
   a wiring layer that is formed to be layered on the semiconductor substrate, wherein the wiring layer includes a guard ring layer in a region corresponding to a region, the region being positioned between a blade region in the scribe line region and the solid-state imaging element, of the semiconductor substrate, and wherein the wiring layer and the guard ring layer include the same material;
   a support substrate that is formed to be layered on the wiring layer; and a groove that is provided in the semiconductor substrate between the blade region in the scribe line region and the solid-state imaging element, wherein the groove penetrates through the semiconductor substrate, wherein a depth of the groove is equal to a depth of the semiconductor substrate, wherein the groove contains a chipping prevention wall, and wherein the chipping prevention wall does not extend into the wiring layer.

2. The solid-state imaging device according to claim 1, wherein the guard ring layer is provided in a region corresponding to a region, the region being positioned between the blade region and the groove, of the semiconductor substrate.

3. The solid-state imaging device according to claim 1, wherein at least a part of the groove is filled with a predetermined material to form the chipping prevention wall.

4. The solid-state imaging device according to claim 1, wherein the whole of the groove is filled with a predetermined material to form the chipping prevention wall.

5. The solid-state imaging device of claim 1,
wherein the chipping prevention wall includes SiN that fills the groove.

6. The solid-state imaging device of claim 1, wherein at least a portion of the inside of the groove is not filled with any material.

7. The solid-state imaging device of claim 1,
wherein the chipping prevention wall includes at least one of a Ti layer, a TiN layer, a Ta layer and a TaN layer on a wall surface of the groove, and at least one of AL or ALCu filling an inside of the groove.

8. The solid-state imaging device of claim 1,
wherein the chipping prevention wall includes at least one of a Ti layer, a TiN layer, a Ta layer, and a TaN layer is formed on a wall surface of the groove, and Cu fills an inside of the groove.

9. The solid-state imaging device of claim 1,
wherein the chipping prevention wall includes at least one of a Ti layer or a TiN layer formed on a wall surface of the groove, and tungsten fills an inside of the groove.

10. The solid-state imaging device of claim 1,
wherein the chipping prevention wall includes $SiO_2$ that fills the groove.

11. The solid-state imaging device of claim 1,
wherein the chipping prevention wall includes SiOC that fills the groove.

12. A semiconductor device, comprising:
a first semiconductor substrate configured to include a semiconductor chip and a scribe line region that is provided along a periphery of the semiconductor chip;
a wiring layer that is formed to be layered on the first semiconductor substrate, wherein the wiring layer includes a guard ring layer in a region corresponding to a region, the region being positioned between a blade region in the scribe line region and the semiconductor chip, of the semiconductor substrate, and wherein the wiring layer and the guard ring layer include the same material;
a second semiconductor substrate that is formed to be layered on the wiring layer; and
a groove that is provided in the first semiconductor substrate between the blade region in the scribe line region and the semiconductor chip, wherein the groove penetrates through the first semiconductor substrate, wherein a depth of the groove is equal to the depth of the semiconductor substrate, wherein the groove contains a chipping prevention wall, and wherein the chipping prevention wall does not extend into the wiring layer.

13. The semiconductor device of claim 12,
wherein the chipping prevention wall includes at least one of:
a SiN layer and a $SiO_2$ layer on a wall surface of the groove;
SiN that fills the groove;
at least one of a Ti layer, a TiN layer, a Ta layer and a TaN layer on a wall surface of the groove, and at least one of AL or ALCu filling an inside of the groove;
at least one of a Ti layer, a TiN layer, a Ta layer, and a TaN layer is formed on a wall surface of the groove, and Cu fills an inside of the groove;
at least one of a Ti layer or a TiN layer formed on a wall surface of the groove, and tungsten fills an inside of the groove;
$SiO_2$ that fills the groove; and
SiOC that fills the groove.

14. The semiconductor device of claim 12, wherein at least a portion of the inside of the groove is not filled with any material.

15. A solid-state imaging device, comprising:
a semiconductor substrate configured to include a solid-state imaging element that is provided with a photoelectric conversion region, and a scribe line region that is provided along a periphery of the solid-state imaging element;
a wiring layer that is formed to be layered on the semiconductor substrate, wherein the wiring layer includes a guard ring layer in a region corresponding to a region, the region being positioned between a blade region in the scribe line region and the solid-state imaging element, of the semiconductor substrate, and wherein the wiring layer and the guard ring layer include the same material;
a support substrate that is formed to be layered on the wiring layer; and
a groove that is provided in the semiconductor substrate between the blade region in the scribe line region and the solid-state imaging element, wherein the groove penetrates through the semiconductor substrate;
a chipping prevention wall formed in the groove, wherein the chipping prevention wall includes polysilicon filling an inside of the groove, wherein the chipping prevention wall does not extend into the wiring layer, and wherein at least one of a SiN layer and a $SiO_2$ layer is formed on a wall surface of the groove.

* * * * *